(12) United States Patent
Yamada et al.

(10) Patent No.: US 11,436,980 B2
(45) Date of Patent: Sep. 6, 2022

(54) DISPLAY DEVICE

(71) Applicant: SHARP KABUSHIKI KAISHA, Sakai (JP)

(72) Inventors: Junichi Yamada, Sakai (JP); Makoto Yokoyama, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 46 days.

(21) Appl. No.: 17/040,939

(22) PCT Filed: Mar. 28, 2018

(86) PCT No.: PCT/JP2018/012691
§ 371 (c)(1),
(2) Date: Sep. 23, 2020

(87) PCT Pub. No.: WO2019/186751
PCT Pub. Date: Oct. 3, 2019

(65) Prior Publication Data
US 2021/0027716 A1    Jan. 28, 2021

(51) Int. Cl.
*G09G 3/3266* (2016.01)
*H01L 27/32* (2006.01)

(52) U.S. Cl.
CPC ....... *G09G 3/3266* (2013.01); *H01L 27/3258* (2013.01); *H01L 27/3276* (2013.01)

(58) Field of Classification Search
CPC ............. G09G 3/3266; H01L 27/3258; H01L 27/3276
See application file for complete search history.

(56) References Cited

U.S. PATENT DOCUMENTS

| 10,636,859 | B2 * | 4/2020 | Park | H01L 27/3223 |
| 10,978,003 | B2 * | 4/2021 | Kim | G09G 3/3266 |
| 2009/0102758 | A1 | 4/2009 | Anzai et al. | |
| 2016/0131929 | A1 * | 5/2016 | Lee | H01L 51/5253 257/72 |
| 2017/0026553 | A1 * | 1/2017 | Lee | G02F 1/133351 |
| 2017/0178563 | A1 | 6/2017 | Anzai et al. | |
| 2017/0249896 | A1 | 8/2017 | Kim et al. | |
| 2017/0301280 | A1 * | 10/2017 | Ka | H01L 27/3223 |

(Continued)

FOREIGN PATENT DOCUMENTS

| CN | 107134473 A | 9/2017 |
| CN | 107342036 A | 11/2017 |

(Continued)

*Primary Examiner* — Patrick N Edouard
*Assistant Examiner* — Eboni N Giles
(74) *Attorney, Agent, or Firm* — ScienBiziP, P.C.

(57) ABSTRACT

Provided is a display device including an irregularly shaped display panel that allows a frame area to be narrowed by utilizing the frame area in a cutout portion. Some emission circuits that respectively correspond to scan circuits arranged in a first curvature portion are arranged in a part of a second side portion that is near the first curvature portion, and remaining emission circuits are arranged in a first notch side portion. Accordingly, the emission circuits arranged in the first notch side portion have lines connected to second emission control lines in a second display area from the first notch side portion side, resulting in a fewer number of lines extending into the first curvature portion.

18 Claims, 18 Drawing Sheets

(56) References Cited

U.S. PATENT DOCUMENTS

| | | |
|---|---|---|
| 2017/0337877 A1 | 11/2017 | Kim et al. |
| 2017/0337878 A1* | 11/2017 | Kim .................. G09G 3/3266 |
| 2018/0083223 A1 | 3/2018 | Saito et al. |
| 2018/0129111 A1 | 5/2018 | Wu et al. |
| 2019/0130840 A1* | 5/2019 | Park .................. G09G 3/3266 |
| 2019/0392767 A1* | 12/2019 | Kim ................ G02F 1/136286 |
| 2020/0394969 A1* | 12/2020 | Kim .................. H01L 27/1214 |
| 2021/0367122 A1* | 11/2021 | Park .................... H01L 33/62 |

FOREIGN PATENT DOCUMENTS

| | | |
|---|---|---|
| CN | 107633800 A | 1/2018 |
| JP | 2009-134246 A | 6/2009 |
| JP | 2017-103252 A | 6/2017 |

\* cited by examiner

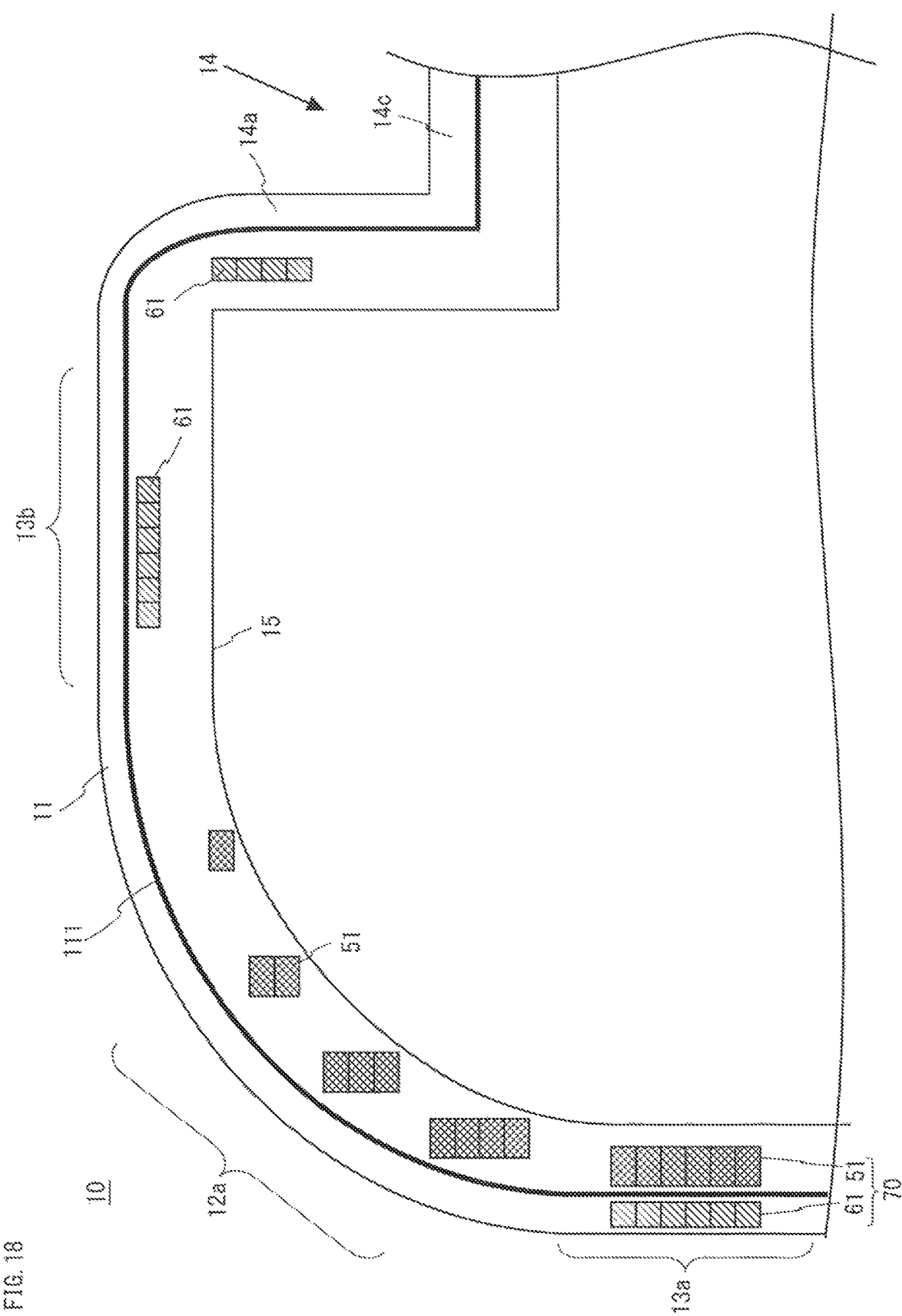

DISPLAY DEVICE

TECHNICAL FIELD

The following disclosure relates to display devices, more specifically to a display device, such as an organic EL display device, which includes electro-optic elements driven by current.

BACKGROUND ART

As a thin display device that achieves high picture quality, low power consumption, etc., an organic EL (electroluminescent) display device is drawing attention and currently under active development. In the organic EL display device, a display panel on which to display an image includes a display area, in which a plurality of pixel circuits are arranged, and a frame area provided around the display area, in which a driver circuit for driving the pixel circuits is disposed.

With proliferation of mobile electronic devices, irregularly shaped display panels (irregularly shaped panels) have been increasingly used in place of conventional rectangular display panels in order to achieve more compact electronic devices. It is often the case that, as such an irregularly shaped display panel, a panel with smooth arc-like corners is used. To allow such an irregularly shaped display panel to have a narrow frame area, it is necessary to also dispose a driver circuit in a corner of the frame area.

Patent Document 1 discloses that when arranging a plurality of driver circuits in a corner of the frame area, a plurality of unit circuits included in a scanning line driver circuit are arranged along an outer edge of a display area, with the unit circuits deviating from one another in the same direction as a direction in which scanning lines extend. As a result, the frame area of a compact, irregularly shaped display panel can be narrowed.

CITATION LIST

Patent Document

Patent Document 1: Japanese Laid-Open Patent Publication No. 2009-134246

SUMMARY OF THE INVENTION

Problems to be Solved by the Invention

Recent years have seen progress in development of organic EL display devices with irregularly shaped display panels including cutout portions (notched portions). Such display panels also are demanded to have narrow corners in frame areas. However, Patent Document 1 does not disclose that the frame area is narrowed in corners by utilizing the frame area in a cutout portion.

Therefore, an objective of the present disclosure is to provide a display device including an irregularly shaped display panel that allows a frame area to be narrowed by utilizing the frame area in a cutout portion.

Solution to the Problems

In a first aspect, a display device includes a display panel including: a display area having arranged therein a plurality of scanning lines, a plurality of emission control lines extending parallel to the scanning lines, a plurality of data lines crossing the scanning lines and the emission control lines, and a plurality of pixel circuits provided near respective intersections of the scanning lines and the data lines; a frame area provided around the display area and having provided therein a plurality of scan circuits configured to output scanning signals to the respective scanning lines, and a plurality of emission circuits configured to output emission control signals to the respective emission control lines; and a cutout portion extending from the frame area to some extent into the display area on at least one side, the frame area includes at least one curvature portion, a first side portion parallel to the data lines, and a second side portion parallel to the scanning lines, the at least one curvature portion being a curved portion positioned between the first side portion and the second side portion, and the emission control lines are connected at an outer edge of the display area to lines extending from the emission circuits that are disposed either in the second side portion or in a lateral section provided in the cutout portion so as to pass through the lateral section.

Effect of the Invention

In the first aspect, the irregularly shaped display panel has a plurality of first driver circuits arranged at least in a first curvature portion in order to output first drive signals to a plurality of first signal lines formed in the display area. Moreover, a plurality of second driver circuits are arranged in a first side portion in order to output second drive signals to a plurality of second signal lines. Thus, it is rendered possible to narrow the first curvature portion and hence the frame area of the irregularly shaped display panel.

BRIEF DESCRIPTION OF THE DRAWINGS

FIG. 18 is a diagram illustrating the positional relationship of the trench shown in FIG. 17 to scan circuits and emission circuits.

MODES FOR CARRYING OUT THE INVENTION

Hereinafter, first and second embodiments will be described with reference to the accompanying drawings. Note that all transistors used in the circuits that will be described below are assumed to be of P-channel type, but the present invention is not limited to this, and the transistors may be of N-channel type. Moreover, in each embodiment, the transistor is, for example, a thin-film transistor (TFT), but the present invention is not limited to this. Further, unless otherwise specified, the term "connection" as used herein is intended to mean "electrical connection" regardless of whether the connection is made directly or indirectly via another element without departing from the scope of the invention.

1. First Embodiment

1.1 Configuration of the Organic El Display Device

Figure 1:
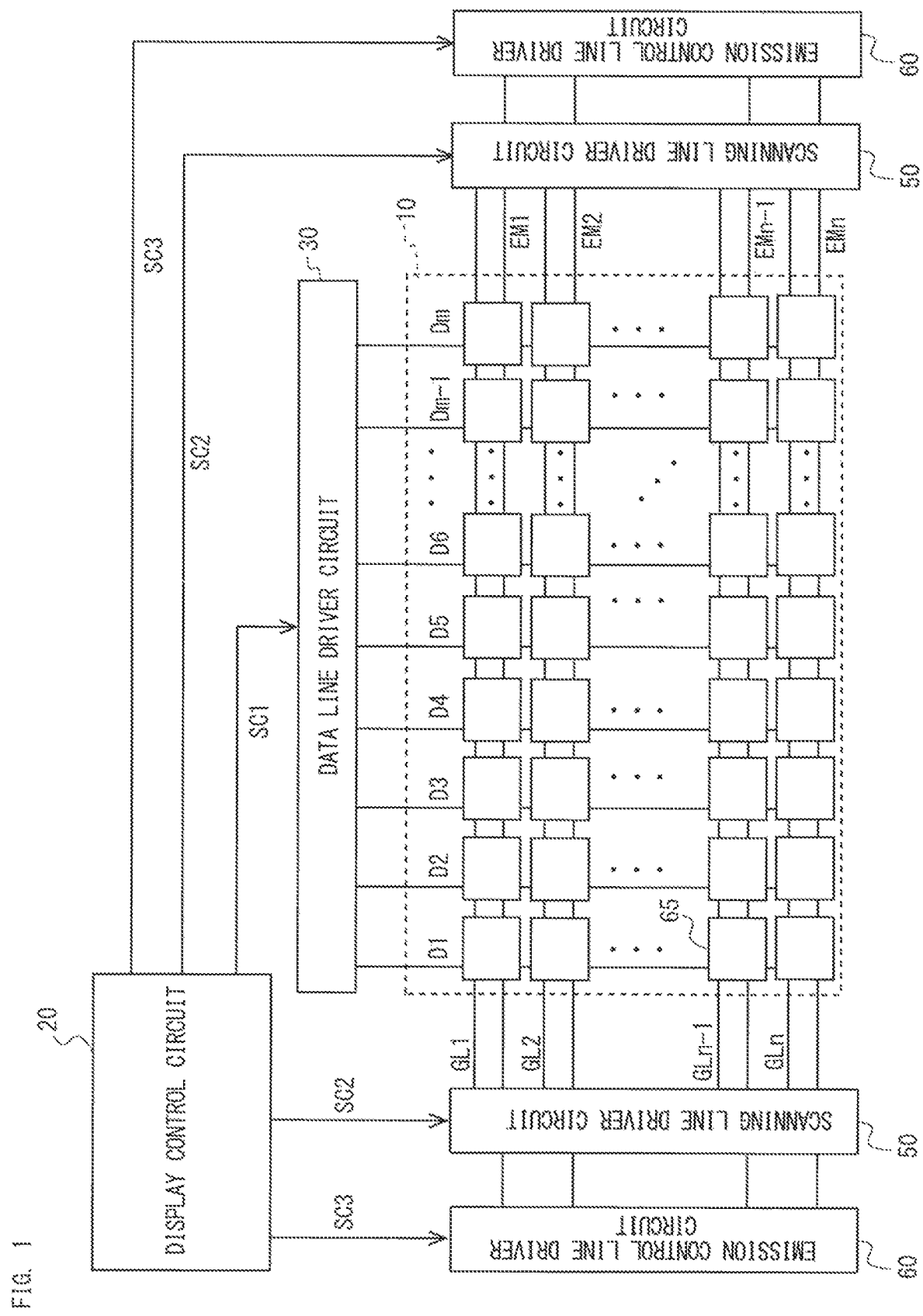
FIG. 1 is a block diagram illustrating the configuration of an organic EL display device according to a first embodiment.

FIG. 1 is a block diagram illustrating the configuration of an organic EL display device according to a first embodiment. As shown in FIG. 1, the organic EL display device (referred to below simply as the "display device") includes a display panel 10, a display control circuit 20, a data line driver circuit 30, scanning line driver circuits 50, and emission control line driver circuits 60. The numbers of scanning line driver circuits 50 and emission control line driver circuits 60 are both two, and these circuits are arranged one each on either side of the display panel 10.

The display panel 10 has m (where m is an integer of 1 or more) data lines D1 to Dm arranged thereon. These data lines D1 to Dm cross n scanning lines GL1 to GLn extending between the scanning line driver circuits 50. Moreover, the n scanning lines GL1 to GLn are parallel to n emission control lines EM1 to EMn extending between the emission control line driver circuits 60. There are pixel circuits 65 provided in the vicinity of respective intersections of the data lines and the scanning lines. The pixel circuits 65 emit light in accordance with data signals supplied through the data lines, thereby displaying an image on the display panel 10.

The data line driver circuit 30 generates and supplies a data signal for one horizontal line per horizontal period to each of the data lines D1 to Dm in accordance with data DA and a control signal SC1, both of which are provided by the display control circuit 20. The scanning line driver circuit 50 sequentially generates and supplies scanning signals to the scanning lines GL1 to GLn in accordance with a control signal SC2 provided by the display control circuit 20. As a result, the pixel circuits 65 that are connected to the scanning lines provided with the scanning signals are sequentially selected. The emission control line driver circuit 60 generates and supplies emission control signals to the emission control lines EM1 to EMn connected to the pixel circuits 65 written with the data signals, in accordance with a control signal SC3 provided by the display control circuit 20. The scanning line driver circuit 50 is constituted by n scanning circuits for respectively driving the scanning lines GL1 to GLn, and the emission control line driver circuit 60 is constituted by n emission circuits for respectively driving the emission control lines EM1 to EMn. These circuits are formed as gate driver monolithic (GDM) circuits in a frame area 11 of the display panel 10.

When each data line is provided with a data signal, whereby a low-level scanning signal is provided to a scanning line, pixel circuits connected to the scanning line are selected, and the data signal is written to the pixel circuits through the data line. At this time, the pixel circuits 65 are provided with a control signal SC3 from the emission control line driver circuit 60 via an emission control line. As a result, a drive current corresponding to the data signal flows through organic EL display elements (electro-optic elements) provided in the pixel circuits 65, so that the organic EL display elements emit light. This allows the pixel circuits 65 to emit light in gradations corresponding to the data signal, thereby displaying an image on the display panel 10.

It should be noted that in the case where the number of output terminals of the data line driver circuit 30 is reduced, demultiplexer portions may be provided between the data line driver circuit 30 and the pixel forming portions so as to drive the display device by a drive method called SSD (source-shared driving) in which the data line driver circuit 30 supplies data signals to the data lines via the demultiplexer portions.

1.2 Shape of the Display Panel

Figure 2:
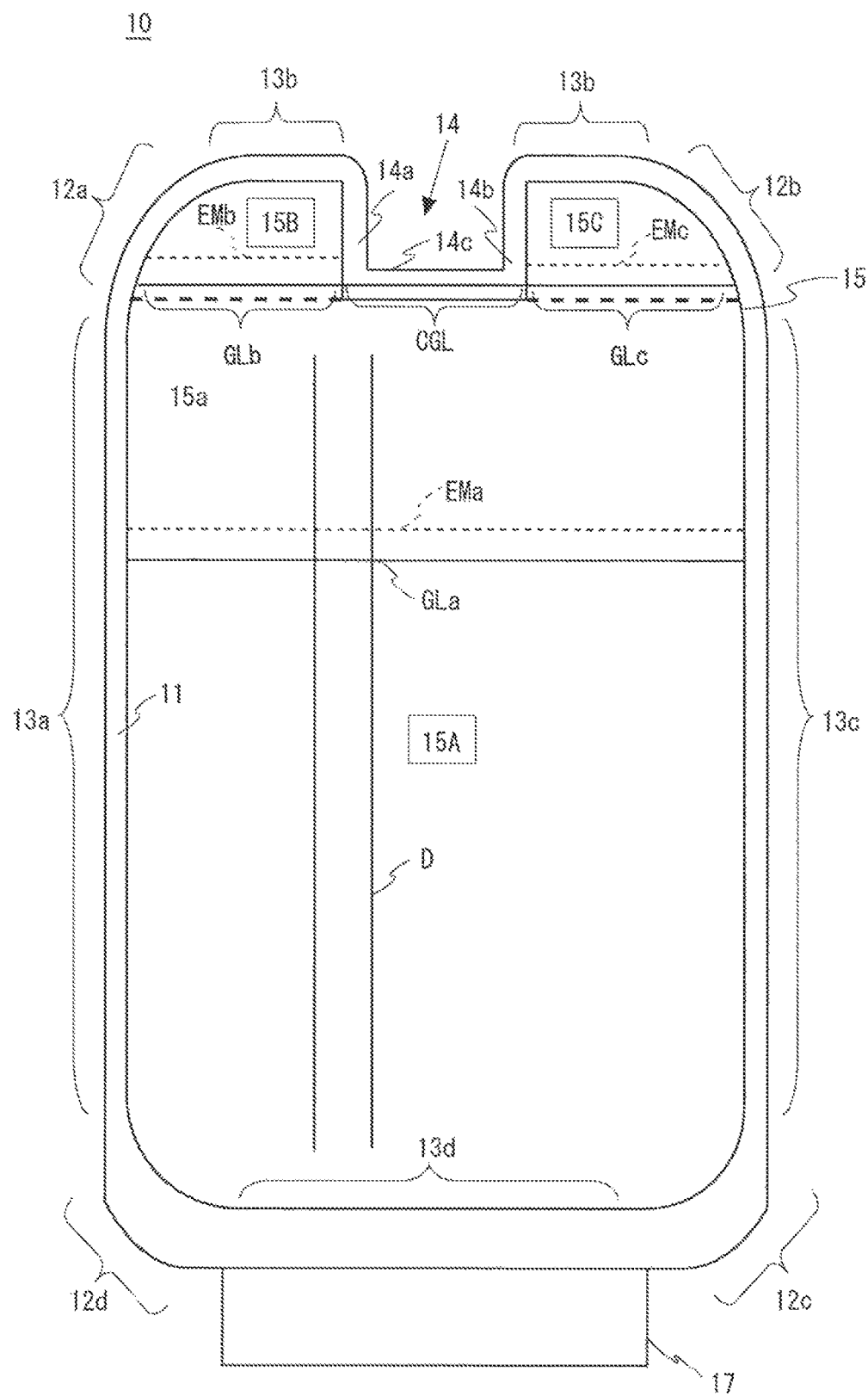
FIG. 2 is a diagram illustrating an irregularly shaped display panel included in the display device shown in FIG. 1.

FIG. 2 is a diagram illustrating the display panel (irregularly shaped panel) 10 provided in an irregular shape and included in the display device of the present embodiment. In the present embodiment, as shown in FIG. 2, the display panel 10 includes a frame area 11 and a display area 15, both of which are curved in corner portions, and all other portions are straight. Accordingly, herein, portions of the frame area 11 that are located between curves in the corners of the display area 15 and the frame area 11 will be referred to as curved portions, and portions of the frame area 11 that are located between straight lines in the corners of the display area 15 and the frame area 11 will be referred to as straight line areas. Therefore, the display panel 10 has four curved portions and four straight line areas, which are formed so as to alternate with each other. Moreover, the display panel 10 has a notched portion (cutout portion) 14 provided at the top so as to incorporate, for example, a lens or suchlike, and the display panel 10 also has a rectangular circuit board 17 provided at the bottom.

For the frame area in each of the four curved portions shown in FIG. 2, the frame area in the upper-left curved portion will be referred to as the "first curvature portion 12a", the frame area in the upper-right curved portion as the "second curvature portion 12b", the frame area in the lower-right curved portion as the "third curvature portion 12c", and the frame area in the lower-left curved portion as the "fourth curvature portion 12d". Moreover, of the four straight line areas, the left straight line area will be referred to as the "first side portion 13a", the top straight line area as the "second side portion 13b", the right straight line area as the "third side portion 13c", and the bottom straight line area as the "fourth side portion 13d". Further, the frame area includes sections located to the left of, to the right of, and at the bottom of the notched portion 14, which will be referred to respectively as "first, second, and third notched side sections 14a, 14b, and 14c". Note that the first to third notch side sections 14a to 14c will also be referred to respectively as the "first to third side portions".

The display area 15 is divided into three areas, a first display area 15A, a second display area (also referred to as a "first discrete area") 15B, and a third display area (also referred to as a "second discrete area") 15C, by a line drawn through and parallel to the third notch side section 14c. The first display area 15A is an area situated between the first side portion 13a and the third side portion 13c. The second display area 15B is an area situated between the first curvature portion 12a and the first notch side section 14a, and the third display area 15C is an area situated between the second curvature portion 12b and the second notch side section 14b. Accordingly, the second display area 15B and the third display area 15C have symmetrical shapes with respect to the notched portion 14.

Described next are scanning lines GL and emission control lines EM formed in each of the first to third display areas 15A to 15C. In the following, of the scanning lines GL, the scanning line that is formed in the first display area 15A will be referred to as the first scanning line GLa, the scanning line that is formed in the second display area 15B will be referred to as the second scanning line (also referred to as the "first discrete scanning line") GLb, and the scanning line that is formed in the third display area 15C will be referred to as the third scanning line (also referred to as the "second discrete scanning line") GLc. Similarly, of the emission control lines EM, the emission control line that is formed in the first display area 15A will be referred to as the first emission control line EMa, the emission control line that is formed in the second display area 15B will be referred to as the second emission control line EMb (also referred to as the "first discrete emission control line"), and the emission control line that is formed in the third display area 15C will be referred to as the third emission control line EMc (also referred to as the "second discrete emission control line").

Furthermore, in portions of the display area 15 that includes the first display area 15A and the second or third area 15B or 15C located thereabove, there are data lines D formed parallel to the first and third side portions 13a and 13c and extending from an edge of the first display area 15A to an edge of the second or third display area 15B or 15C. Moreover, in a part with the notched portion 14, there are data lines D formed parallel to the first and third side portions 13a and 13c and extending from one edge to the opposite edge of the first display area 15A. Note that if the data lines D are depicted as extending from edge to edge in each area, the data lines D can be difficult to see among other lines and elements and therefore are not shown around the edges.

In the first display area 15A, both the first scanning line GLa and the first emission control line EMa are formed so as to extend from the edge of the first side portion 13a to the edge of the third side portion 13c. In the second display area 15B, the second emission control line EMb is formed so as to extend from the edge of the first curvature portion 12a to the edge of the first notch side section 14a. The third emission control line EMc is formed so as to extend from the edge of the second curvature portion 12b to the edge of the second notch side section 14b. Accordingly, the second emission control line EMb and the third emission control line EMc are separated by the notched portion 14 and hence are not connected. However, the second scanning line GLb formed in the second display area 15B and the third scanning line GLc formed in the third display area 15C constitute a single scanning line by being connected to a connection line CGL formed across the first to third notch side sections 14a to 14c.

As will be described later, the second emission control line EMb and the third emission control line EMc are supplied with respectively different emission control signals from respectively different emission circuits. However, the single scanning line that include these lines is connected at one end to a scan circuit 51 disposed in the first curvature portion 12a and at the other end to a scan circuit 51 disposed in the second curvature portion 12b. Accordingly, the scanning line receives the same scanning signal simultaneously inputted from both ends. Thus, the scanning line is resistant to occurrence of signal waveform rounding due to load capacitance.

Figure 3:
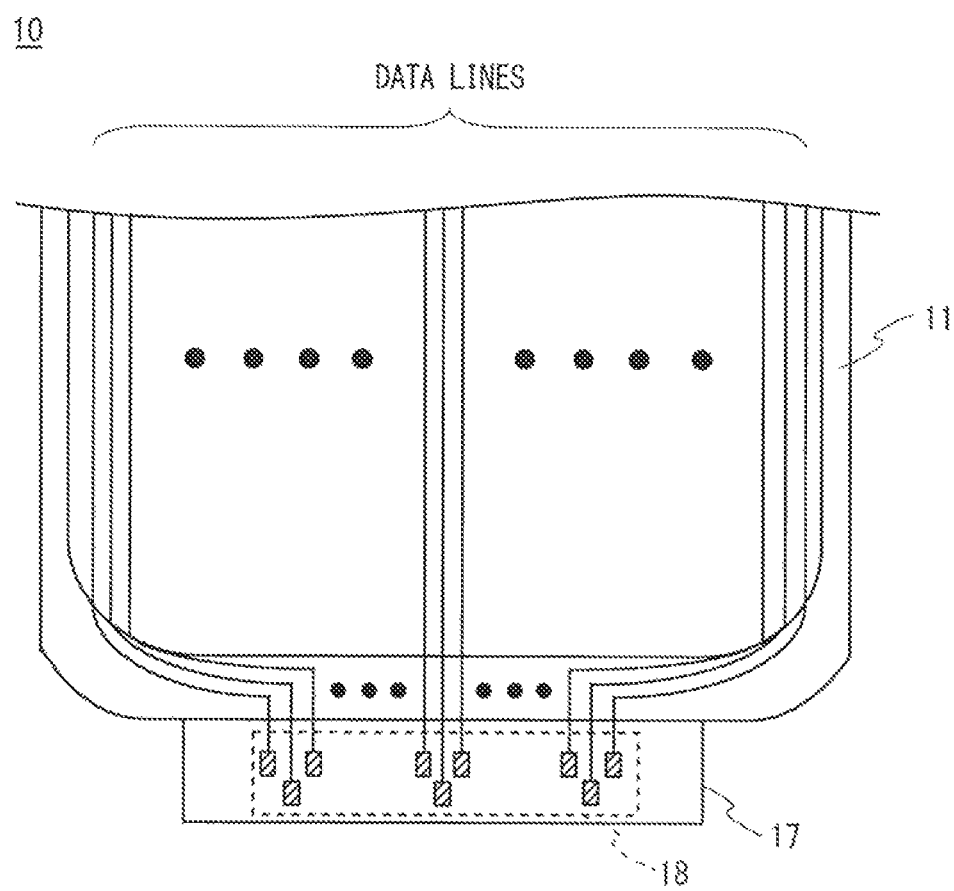
FIG. 3 is a diagram illustrating lines formed in a lower portion of the display panel shown in FIG. 2.

FIG. 3 is a diagram illustrating lines formed in a lower portion of the display panel 10. As shown in FIG. 3, the display panel is connected to the circuit board 17, which includes a terminal portion 18 consisting of terminals for connecting the m data lines extending from the data line driver circuit 30, which is located externally, to m data lines formed in the display area 15. Moreover, the terminal portion 18 connects the lines in the display panel 10 not only to the data lines but also to lines for supplying clock signals and drive voltages to the scan circuits 51 and the emission circuits 61 arranged in the frame area 11.

1.3 Scan Circuit

Figure 4:
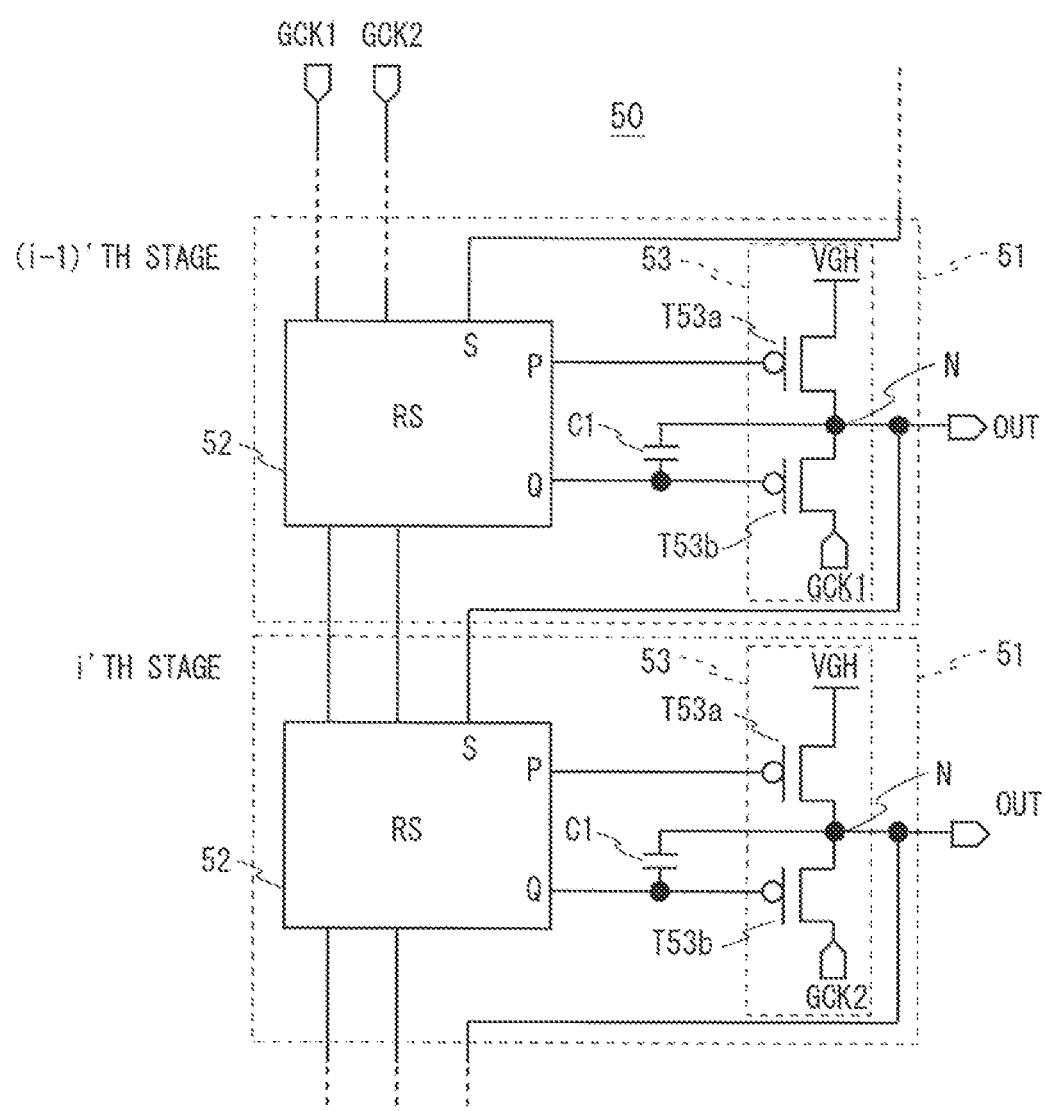
FIG. 4 is a block diagram illustrating the configuration of scan circuits included in the display device shown in FIG. 1.

FIG. 4 is a block diagram illustrating the configuration of scan circuits 51 included in the display device according to the present embodiment. The scanning line driver circuit 50 consists of n (where n is an integer of 1 or more) scan circuits 51 connected in multiple stages. In FIG. 4, only the (i−1)'th (where i is an integer such that 2≤i≤n) and the i'th of the scan circuits 51 are shown. Signals inputted or outputted via specific terminals will be referred to below by the same names as the terminals. For example, a signal inputted via a clock terminal GCK1 will be referred to as a clock signal GCK1.

Each of the i'th and (i−1)'th scan circuits 51 includes a known RS flip-flop circuit 52, and an output control circuit 53 connected to the RS flip-flop circuit 52. The RS flip-flop circuit 52 is provided with clock terminals GCK1 and GCK2, an input terminal S, and output terminals P and Q. The output control circuit 53 is a circuit configured by two P-channel transistors T53a and T53b connected in series, and the transistor T53a has a gate terminal connected to the output terminal P of the RS flip-flop circuit 52, and a source terminal connected to a high-level power line VGH. The transistor T53b has a gate terminal connected to the output terminal P of the RS flip-flop circuit 52, and a source terminal connected to a drain terminal of the transistor T53a.

Furthermore, there is a capacitor C1 provided between the output terminal Q and a node N at which the drain terminal of the transistor T53a and the source terminal of the transistor T53b are connected. There is an output terminal OUT extending from the node N and connected to a corresponding scanning line and an input terminal S in the next stage. Note that the drain terminal of the transistor T53b in the (i−1)'th stage is connected to the clock terminal GCK1, and the drain terminal of the transistor T53b in the i'th stage is connected to the clock terminal GCK2.

Figure 5:
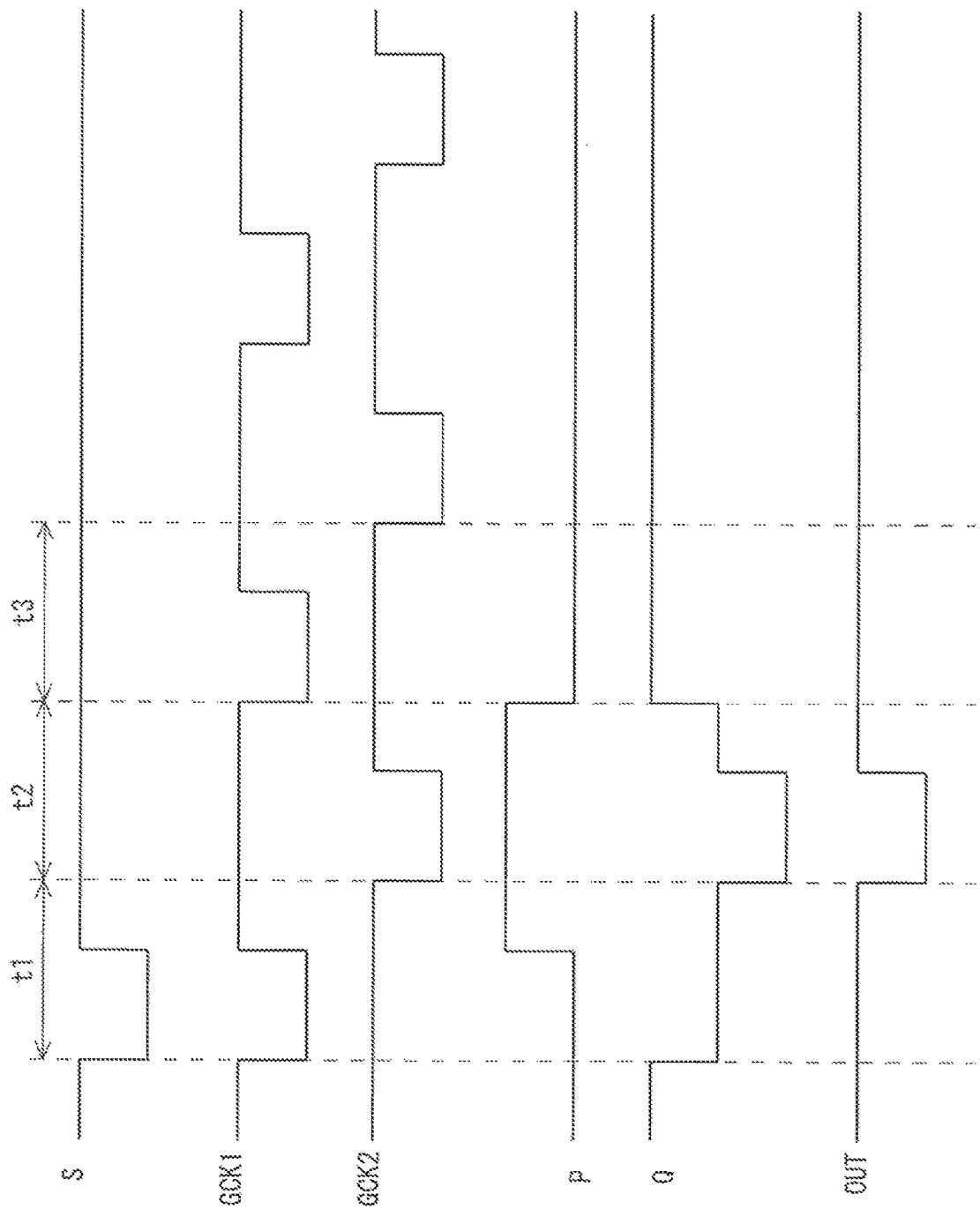
FIG. 5 is a timing chart for the scan circuit shown in FIG. 4.

FIG. 5 is a timing chart for the scan circuit 51 shown in FIG. 4. As shown in FIG. 5, during the first part of period t1, the RS flip-flop circuit 52 is supplied with a low-level input signal S from the output terminal OUT of the scan circuit 51 in the preceding stage, the clock terminals GCK1 and GCK2 are respectively supplied with a low-level clock signal GCK1 and a high-level clock signal GCK2, and then the RS flip-flop circuit 52 outputs a low-level output signal P and an output signal Q. The output signal P is supplied to the gate terminal of the transistor T53a, and the output signal Q is supplied to the gate terminal of the transistor T53b. As a result, the transistor T53a is rendered in ON state, and the transistor T53b is rendered in OFF state, so that the output control circuit 53 outputs a high-level output signal OUT.

During the second part of period t1, the RS flip-flop circuit 52 is supplied with a high-level input signal S from the scan circuit 51 in the preceding stage, the clock terminals GCK1 and GCK2 are respectively supplied with a high-level clock signal GCK1 and a clock signal GCK2, and then the RS flip-flop circuit 52 outputs a high-level output signal P and a low-level output signal Q. As a result, the transistor T53a is rendered in OFF state, and the transistor T53b is rendered in ON state, so that the output control circuit 53 outputs a high-level output signal OUT.

During the first part of period t2, the RS flip-flop circuit 52 is supplied with a high-level input signal S from the scan circuit 51 in the preceding stage, the clock terminals GCK1 and GCK2 are respectively supplied with a high-level clock signal GCK1 and a low-level clock signal GCK2, and then the RS flip-flop circuit 52 outputs a high-level output signal P and a low-level output signal Q. As a result, the transistor T53a is rendered in OFF state, and the transistor T53b is rendered in ON state, so that the output control circuit 53 outputs a low-level output signal OUT. Consequently, the scanning line that is connected to the output terminal OUT of the scan circuit 51 is selected, whereby the pixel circuits that are connected to the scanning line are selected. Accordingly, the pixel circuits have data signals written through the data lines. Note that the capacitor C1 functions as a bootstrap capacitor, and therefore the voltage that is applied to the gate terminal of the transistor T53b is lower than the voltage of the output signal Q. Thus, the transistor T53b can output a low-level clock signal GCK2 without changing the voltage level.

During the second part of period t2, the RS flip-flop circuit 52 is supplied with a high-level input signal S from the scan circuit 51 in the preceding stage, the clock terminals GCK1 and GCK2 are respectively supplied with high-level clock signals GCK1 and GCK2, and then the RS flip-flop circuit 52 outputs a high-level output signal P and a low-level output signal Q. As a result, the transistor T53a is rendered in OFF state, and the transistor T53b is rendered in ON state, so that the output control circuit 53 outputs a high-level output signal OUT.

During the first part of period t3, the RS flip-flop circuit 52 is supplied with a high-level input signal S from the scan circuit 51 in the preceding stage, the clock terminals GCK1 and GCK2 are respectively supplied with a low-level clock signal GCK1 and a high-level clock signal GCK2, and then the RS flip-flop circuit 52 outputs a low-level output signal P and a high-level output signal Q. As a result, the transistor T53a is rendered in ON state, and the transistor T53b is rendered in OFF state, so that the output control circuit 53 outputs a high-level output signal OUT.

Similarly, during the second part of period t3, the transistor T53a is rendered in ON state and the transistor T53b is rendered in OFF state, with the result that the output control circuit 53 outputs a high-level output signal OUT. During the following periods, high-level output signals OUT are similarly outputted. In this manner, when the high-level output signal OUT is outputted, the pixel circuits that are connected to the scanning line that corresponds to the output terminal OUT are not selected, and therefore, no data signal is written to the pixel circuits.

1.4 Emission Circuit

Figure 6:
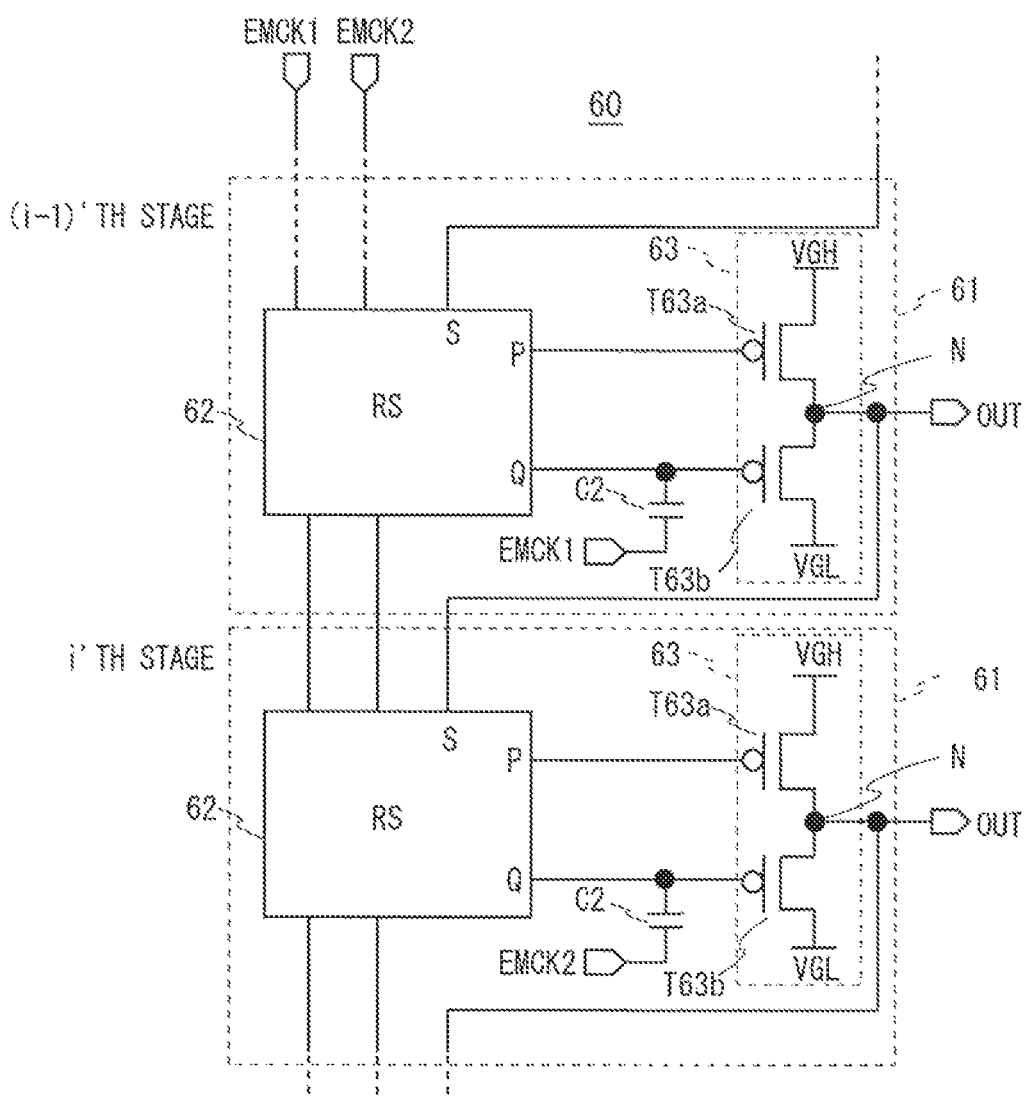
FIG. 6 is a block diagram illustrating the configuration of an emission circuit included in the display device shown in FIG. 1.

The emission circuit will be described next. FIG. 6 is a block diagram illustrating the configuration of the emission circuit 61 included in the display device according to the present embodiment. The emission control line driver circuit 60 consists of n emission circuits 61 connected in multiple stages, and FIG. 6 shows the (i−1)'th and the i'th of the emission circuits 61.

The configuration of the emission circuit 61 shown in FIG. 6 is similar to the configuration of the scan circuit 51 shown in FIG. 4, and therefore differences will be mainly described. As shown in FIG. 6, the emission circuit 61 also includes a known RS flip-flop circuit 62, and an output control circuit 63 connected to the RS flip-flop circuit 62. The RS flip-flop circuit 62 is provided with clock terminals EMCK1 and EMCK2. The output control circuit 63 consists of two transistors T63a and T63b with drain terminals connected to a low-level power line VGL, and the transistor T63b has a gate terminal connected to one end of a capacitor C2. Accordingly, the output control circuit 63 can stably output a low-level output signal OUT. Moreover, the capacitor C2 in the (i−1)'th stage is connected at the other end to the clock terminal EMCK1, and the capacitor C2 in the i'th stage is connected at the other end to the clock terminal EMCK2.

Figure 7:
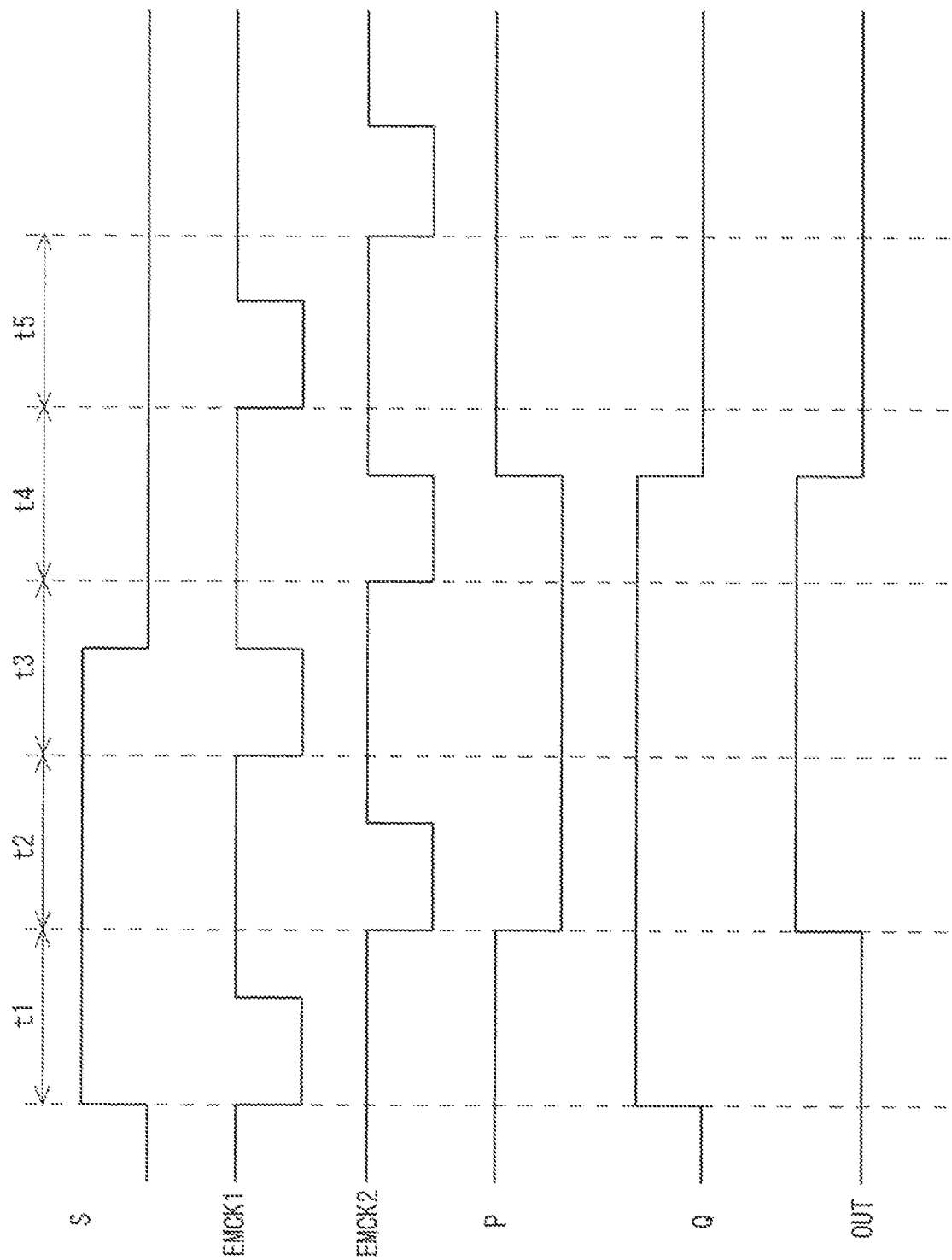
FIG. 7 is a timing chart for the emission circuit shown in FIG. 6.

FIG. 7 is a timing chart for the emission circuit 61 shown in FIG. 6. As shown in FIG. 7, during the first part of period t1, the RS flip-flop circuit 62 is supplied with a high-level input signal S from the emission circuit 61 in the preceding stage, the clock terminals EMCK1 and EMCK2 are respectively supplied with a low-level clock signal EMCK1 and a high-level clock signal EMCK2. The RS flip-flop circuit 62 outputs a high-level output signal P and a low-level output signal Q. The output signal P is supplied to the gate terminal of the transistor T63a, and the output signal Q is supplied to the gate terminal of the transistor T63b. As a result, the transistor T63a is rendered in OFF state, and the transistor T63b is rendered in ON state, so that the output control circuit 63 outputs a low-level output signal OUT.

During the second part of period t1, the RS flip-flop circuit 62 is supplied with a high-level input signal S, the clock terminals EMCK1 and EMCK2 are respectively supplied with high-level clock signals EMCK1 and EMCK2, and then the RS flip-flop circuit 62 outputs a high-level output signal P and a low-level output signal Q. As a result, the transistor T63a is rendered in OFF state, and the transistor T63b is rendered in ON state, so that the output control circuit 63 outputs a low-level output signal OUT.

During the first part of period t2, the RS flip-flop circuit 62 is supplied with a high-level input signal S, the clock terminals EMCK1 and EMCK2 are respectively supplied with a high-level clock signal EMCK1 and a low-level clock signal EMCK2, and then the RS flip-flop circuit 62 outputs a low-level output signal P and a high-level output signal Q. As a result, the transistor T63a is rendered in ON state, and the transistor T63b is rendered in OFF state, so that the output control circuit 63 outputs a high-level output signal OUT.

During the second part of period t2, the RS flip-flop circuit 62 is supplied with a high-level input signal S, the clock terminals EMCK1 and EMCK2 are respectively supplied with high-level clock signals EMCK1 and EMCK2, and then a low-level output signal P and a high-level output signal Q are outputted. As a result, the transistor T63a is rendered in ON state, and the transistor T63b is rendered in OFF state, so that the output control circuit 63 outputs a high-level output signal OUT.

During the first part of period t3, the RS flip-flop circuit 62 is supplied with a high-level input signal S, a low-level clock signal EMCK1 and a high-level clock signal EMCK2 are supplied, and then the RS flip-flop circuit outputs a low-level output signal P and a high-level output signal Q. As a result, the transistor T63a is rendered in ON state, and the transistor T63b is rendered in OFF state, so that the output control circuit 63 outputs a high-level output signal OUT.

During the second part of period t3 and the first part of period t4, similar to during the second part of period t2, a high-level output signal OUT is outputted, and during the first part of period t4, similar to during the first part of period t2, a high-level output signal OUT is outputted. During the first part of period t5, similar to during the first part of period t1, a low-level output signal OUT is outputted, and during the second part of period t5, similar to the second part of period t1, a low-level output signal OUT is outputted. Thereafter, similarly, once a low-level output signal OUT is outputted, a corresponding emission control line is selected, transistors (not shown) connected to organic EL display elements in pixel circuits are rendered in ON state. As a result, during periods following period t5, the organic EL display elements have a drive current flowing therethrough and therefore emit light.

Figure 8:
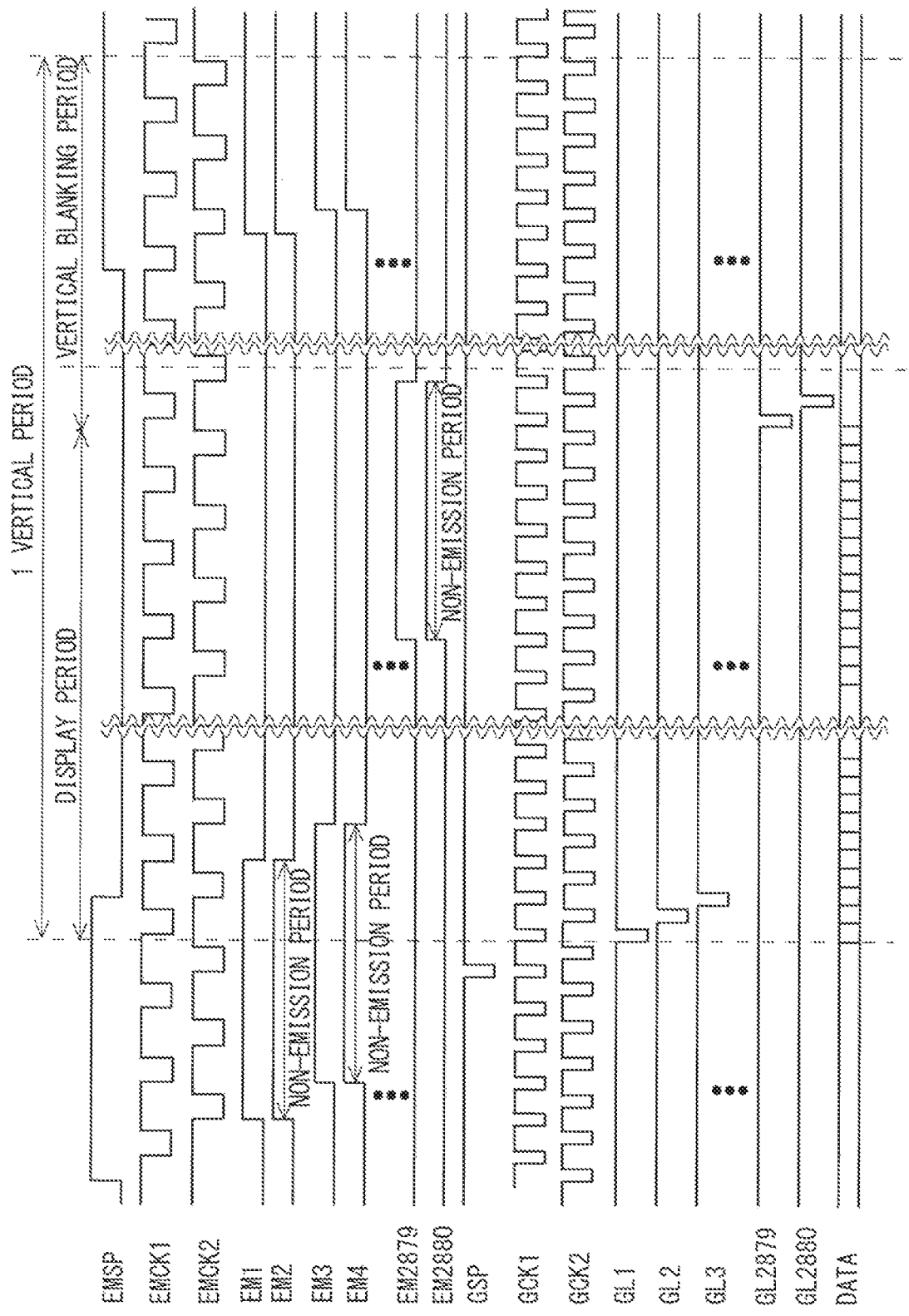
FIG. 8 is a timing chart illustrating the operation of the display device shown in FIG. 1.

FIG. 8 is a timing chart illustrating the operation of the display device in the present embodiment. As shown in FIG. 8, one vertical period includes a display period and a vertical blanking period subsequent thereto. The lower part of the timing chart shows times at which the scanning lines GL1 to GLn are sequentially set to a low potential level in accordance with clock signals GCK1 and GCK2. At the time when a scanning line is set low, a data line corresponding thereto is supplied with a data signal, with the result that the data signal is written through the data line to the pixel circuits that are connected to the scanning line supplied with a low-level scanning signal. In this manner, the data signal is written sequentially to the pixel circuits connected to the scanning lines. Note that the relationship between the clock signals GCK1 and GCK2 and the output signal of the scan circuit 51 is the same as that described in conjunction with the timing chart shown in FIG. 5 and therefore will not be elaborated upon herein.

The upper part of the timing chart shows times at which the emission control lines EM1 to EMn are sequentially set to a high potential level in accordance with clock signals EMCK1 and EMCK2. In this case, prior to the low-level scanning signal being supplied to the scanning line, the emission control line is supplied with a high-level emission control signal, so that no drive current flows through the organic EL display elements of the pixel circuits. Accordingly, this period serves as a non-emission period.

Thereafter, once the data signal is written to the pixel circuits, the emission control line is supplied with a low-level emission control signal. As a result, the organic EL display elements have a current flowing therethrough in accordance with the data signal and emit light in gradations corresponding to the data signal. Subsequently, the emission control line is maintained at the low potential level until the blanking period, so that the organic EL display elements continue to emit light until the vertical blanking period. Note that the emission control lines are changed from a high to a low potential level in pairs, and therefore the pixel circuits sequentially emit light group by group, each group being connected to two emission control lines, and the emission continues until the vertical blanking period. Note that the relationship between the clock signals EMCK1 and EMCK2 and the output signal of the emission circuit is the same as that described in conjunction with the timing chart shown in FIG. 7 and therefore will not be elaborated upon.

1.5 Arrangement of the Scan Circuit and the Emission Circuit

1.5.1 Arrangement in Comparative Example

Figure 9:
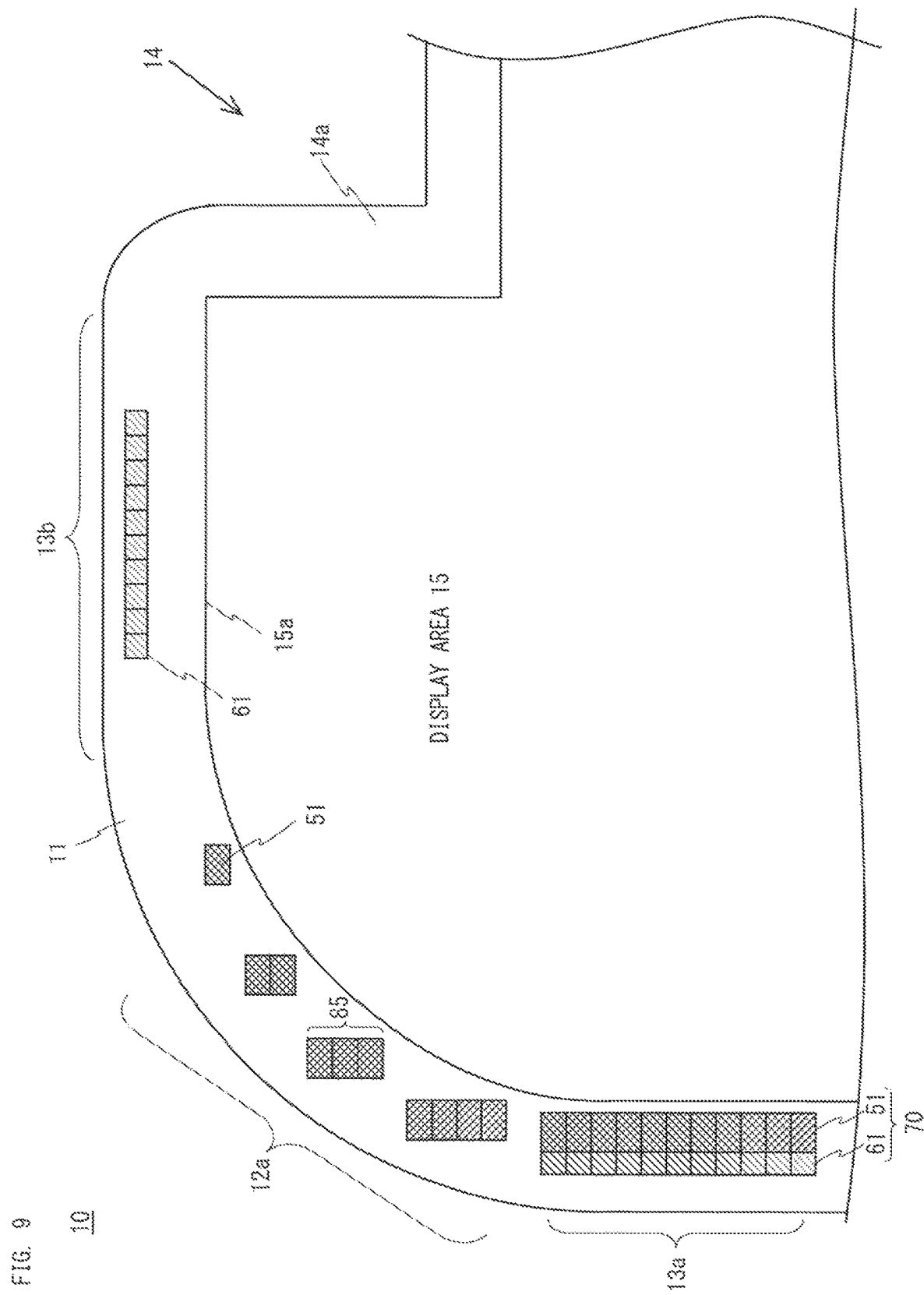
FIG. 9 is a view illustrating a display panel with scan circuits and emission circuits arranged therein in a comparative example of the first embodiment.

Before describing the present embodiment, a comparative example will be described first for easy understanding of the present embodiment. FIG. 9 is an enlarged view of a portion of the display panel 10 in a comparative example of the present embodiment. As shown in FIG. 9, scan circuits 51 and emission circuits 61 are arranged in the first side portion 13a in the display panel 10, parallel circuit blocks 85, each including a plurality of scan circuits 51 arranged in parallel are arranged in the first side portion 13a, and arranged in the second side portion 13b are emission circuits 61 adapted to output emission control signals to pixel circuits 65 connected to the scan circuit 51 arranged in the first curvature portion 12a. However, there is no circuit arranged in the first notch side section 14a of the notched portion 14. Note that the emission circuits 61 and the scan circuits 51 will also be referred to below as, for example, "the emission circuits that correspond to the scan circuits", and "the scan circuits that correspond to the emission circuits" where the emission circuits 61 and the scan circuits 51 respectively supply emission control signals and scanning signals to the pixel circuits that are connected to the same scanning signal line.

The first side portion 13a of the display panel 10 is a straight line area where unit circuit blocks 70, each consisting of one scan circuit 51 and one emission circuit 61 connected in series, are arranged along the longitudinal axis of the first side portion 13a. The scan circuit 51 included in each unit circuit block 70 is disposed near the outer edge 15a of the first display area 15A, and the emission circuit 61 is disposed outside with respect to the corresponding scan circuit 51 connected in series thereto. Each unit circuit block 70 is disposed with the longitudinal axis oriented parallel to the direction in which the first scanning lines GLa extend.

In the first curvature portion 12a, the parallel circuit blocks 85, each consisting of scan circuits 51, are arranged along the outer edge 15a of the second display area 15B, and the emission circuits 61 that correspond to the scan circuits 51 are arranged in a line in the second side portion 13b.

Figure 10:
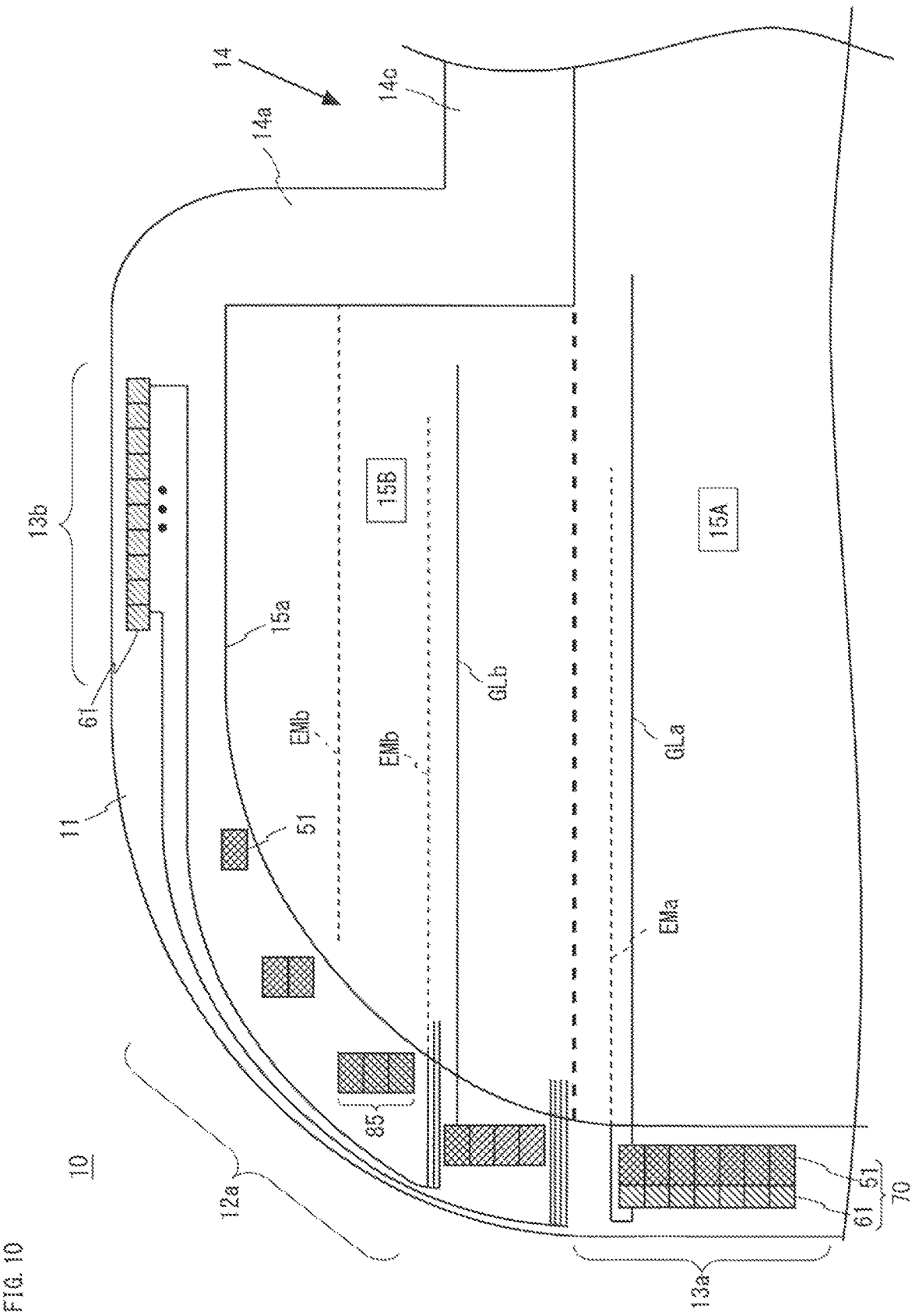
FIG. 10 is a diagram illustrating some lines formed in a first curvature portion and a second side portion of the display panel in the first embodiment.

FIG. 10 is a diagram illustrating some lines formed in the first curvature portion 12a and the second side portion 13b of the display panel 10 shown in FIG. 9. As shown in FIG. 10, the scan circuits 51 and the emission circuits 61 arranged in the first side portion 13a are respectively connected to first scanning lines GLa and first emission control lines EMa. Lines extending from the scan circuits 51 arranged in the first curvature portion 12a are connected to second scanning lines GLb at the outer edge 15a of the second display area 15B, and all lines from the emission circuits 61 arranged in the second side portion 13b extend along the periphery of the first curvature portion 12a and are connected to second emission control lines EMb at the outer edge 15a of the second display area 15B. Accordingly, in the first curvature portion 12a, the sum of the widths of the lines extending from the emission circuit 61 in the second side portion 13b is large. Accordingly, the first curvature portion 12a is widened unfavorably.

1.5.2 Arrangement in the First Embodiment

Figure 11:
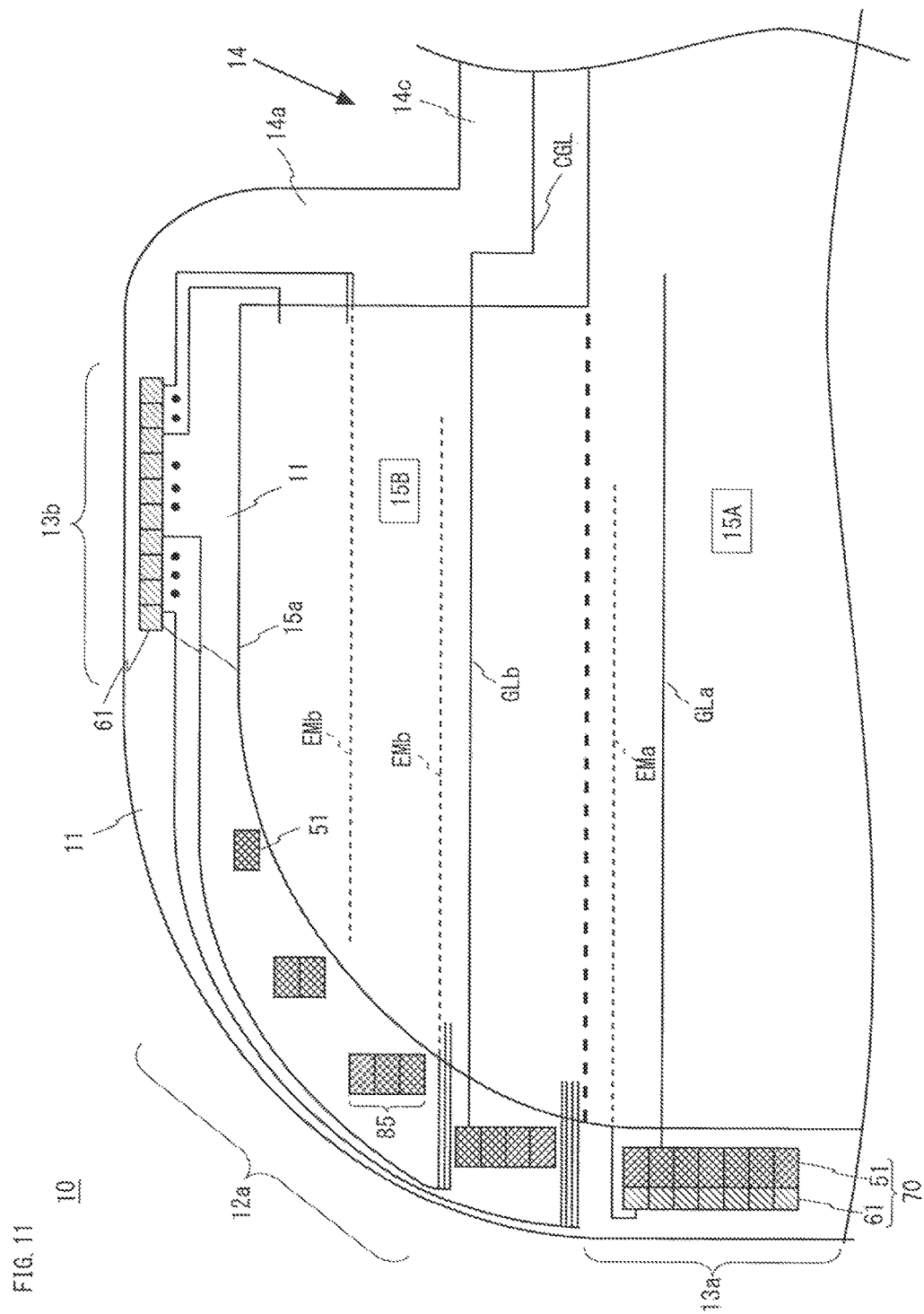
FIG. 11 is a diagram illustrating a portion of the display panel in the first embodiment.

FIG. 11 is a diagram illustrating a portion of the display panel 10 in the present embodiment. As shown in FIG. 11, in the display panel 10 of the present embodiment, as in the comparative example shown in FIG. 10, arranged in the first side portion 13a of the display panel 10 are scan circuits 51 and emission circuits 61, arranged in the first curvature portion 12a are parallel circuit blocks 85, each consisting of a plurality of scan circuits 51 disposed in parallel, and arranged in a line in the second side portion 13b are emission circuits 61 that correspond to the scan circuits 51.

The scan circuits 51 and the emission circuits 61 arranged in the first side portion 13a are respectively connected to first scanning lines GLa and first emission control lines EMa formed in the first display area 15A. The scan circuits 51 that constitute the parallel circuit blocks 85 arranged in the first curvature portion 12a are connected to second scanning lines GLb formed in the second display area 15B.

The scan circuits 51 arranged in the first curvature portion 12a supply scanning signals to the respectively corresponding second scanning lines GLb formed in the second display area 15B and connected to the scan circuits 51. Moreover, although not shown in FIG. 11, there are third scanning lines connected to the scan circuits 51 and formed in the third display area 15C, which is provided so as to be symmetrical to the second display area 15B with respect to the notched portion 14. As will be described later, the third emission control lines formed in the third display area 15C are not connected to the second emission control lines EMb. However, the third scanning line constitutes a single scanning line by being connected to the second scanning line GLb via the connection line CGL formed across the side portions 14a to 14c of the notched portion 14. Accordingly, the pixel circuits that are connected to both the second scanning line GLb and the third scanning line are simultaneously supplied with the same scanning signal from the scan circuits 51 in the first and second curvature portions 12a and 12b.

In the second side portion 13b, some of the emission circuits 61 that are arranged near the first curvature portion 12a are connected to lines that extend along the outer periphery of the first curvature portion 12a, and the lines are diverted from the first curvature portion 12a to the second display area 15B and connected to the second emission control lines EMb formed in the second display area 15B. On the other hand, of the remaining emission circuits 61 arranged in the second side portion 13b that correspond to the scan circuits 51 arranged in the first curvature portion 12a, those that are arranged near the first notch side section 14a are connected to lines extending through the first notch side section 14a to the second display area 15B and connected to the second emission control lines EMb formed in the second display area 15B. In this manner, the second emission control lines EMb include the lines that are supplied with emission control signals from the first curvature portion 12a and the lines that are supplied with emission control signals from the first notch side section 14a.

Furthermore, although not shown in FIG. 11, the third emission control lines formed in the third display area 15C similarly include the third emission control lines that are connected to the emission circuits 61 in the second side portion 13b that are arranged near the second curvature portion 12b and the third emission control lines EMc that are connected to the emission circuits 61 in the second side portion 13b that are arranged near the second notch side section 14b. However, the second emission control lines EMb and the third emission control lines Emc are not connected and therefore are supplied independently of each other with emission control signals respectively from the emission circuits 61 in the second side portion 13b that are arranged near the first curvature portion 12a and the emission circuits 61 in the second side portion 13b that are arranged near the second curvature portion 12b.

1.6 Effects

In the present embodiment, the lines that are connected to some emission circuits 61 in the second side portion 13b that are arranged near the first curvature portion 12a are arranged so as to extend from the emission circuits 61 along the outer periphery of the first curvature portion 12a and be connected to the second emission control lines EMb at the boundary of the first curvature portion 12a and the second display area 15B, and the lines that are connected to the rest of the emission circuits 61 in the second side portion 13b, which are arranged near the notched portion 14, are arranged so as to extend from the emission circuits 61 along the first notch side section 14a and be connected to the second emission control lines EMb at the boundary of the first notch side section 14a and the second display area 15B. This renders it possible to reduce the number of lines extending from the emission circuits 61 along the outer periphery of the first curvature portion 12a. Thus, it is rendered possible to decrease the sum of the widths of the lines and thereby narrow the frame area of the display panel 10.

Furthermore, the lines that are connected to the emission circuits 61 in the second side portion 13b that are arranged near the notched portion 14 extend from the emission circuits 61 through the first notch side section 14a and are connected to the second emission control lines EMb at the boundary with the second display area 15B. Accordingly, the distance from the emission circuits 61 to the second emission control lines EMb can be shortened, resulting in a reduced load capacitance on the second emission control lines. Thus, it is rendered possible to inhibit waveform rounding of the emission control signals.

1.7 Variant

Figure 12:
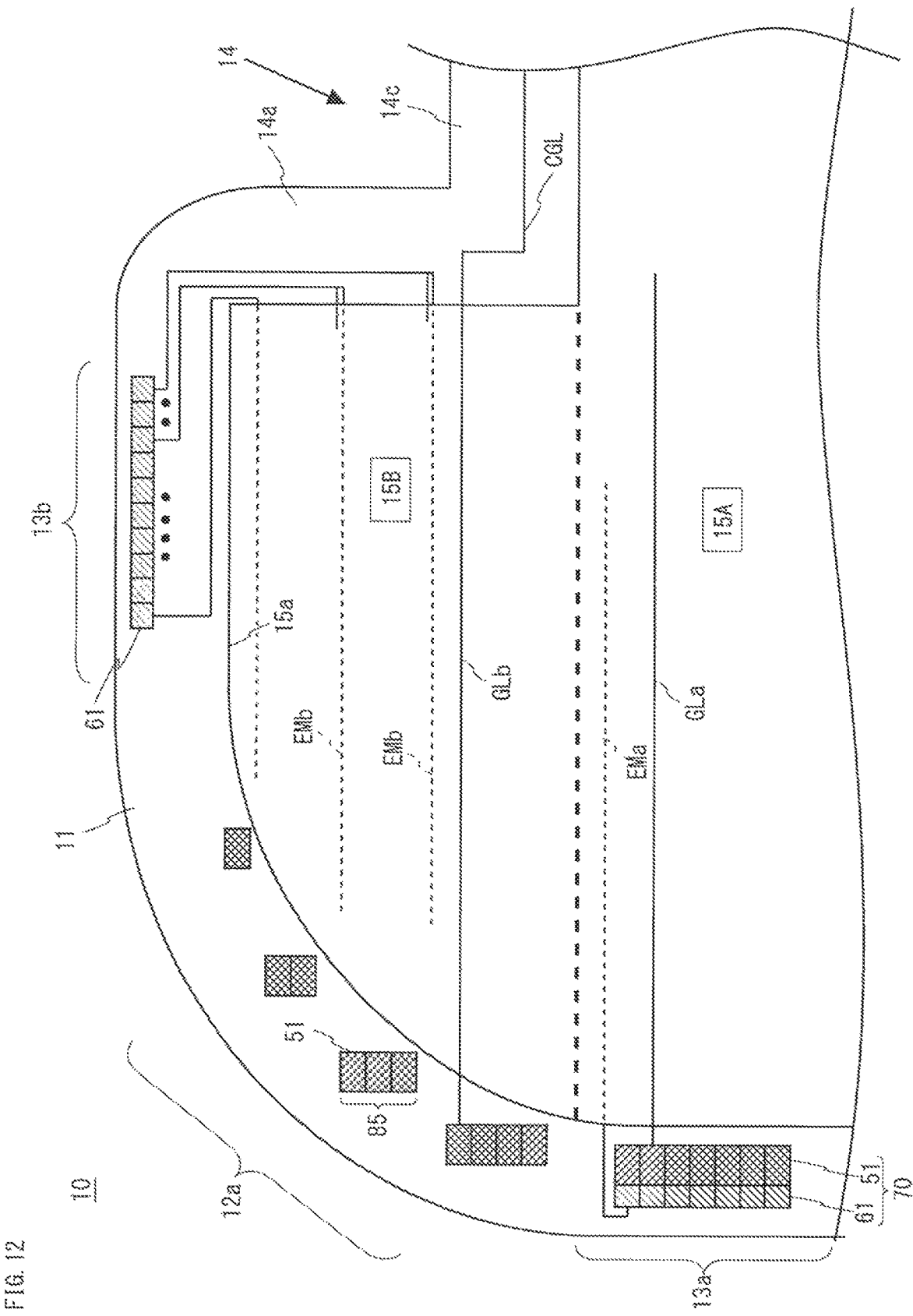
FIG. 12 is a diagram illustrating a portion of a display panel in a variant of the first embodiment.

FIG. 12 is a diagram illustrating a portion of the display panel 10 in a variant of the present embodiment. As shown in FIG. 12, in the present variant, all lines from all emission circuits 61 arranged in the second side portion 13b extend through the first notch side section 14a and are connected to respectively corresponding second emission control lines EMb in the second display area 15B. Accordingly, there are no lines extending from the emission circuits 61 in the second side portion 13b to the first curvature portion 12a, and therefore the first curvature portion 12a can be further narrowed.

2. Second Embodiment

The configuration of a display device according to a second embodiment, the shape of the display panel, and the configuration and the operation of the scan circuit 51 and the emission circuit 61 arranged in the display panel, are the same as in the first embodiment and therefore will not be elaborated upon.

2.1 Arrangement of the Scan Circuit and the Emission Circuit

Figure 13:
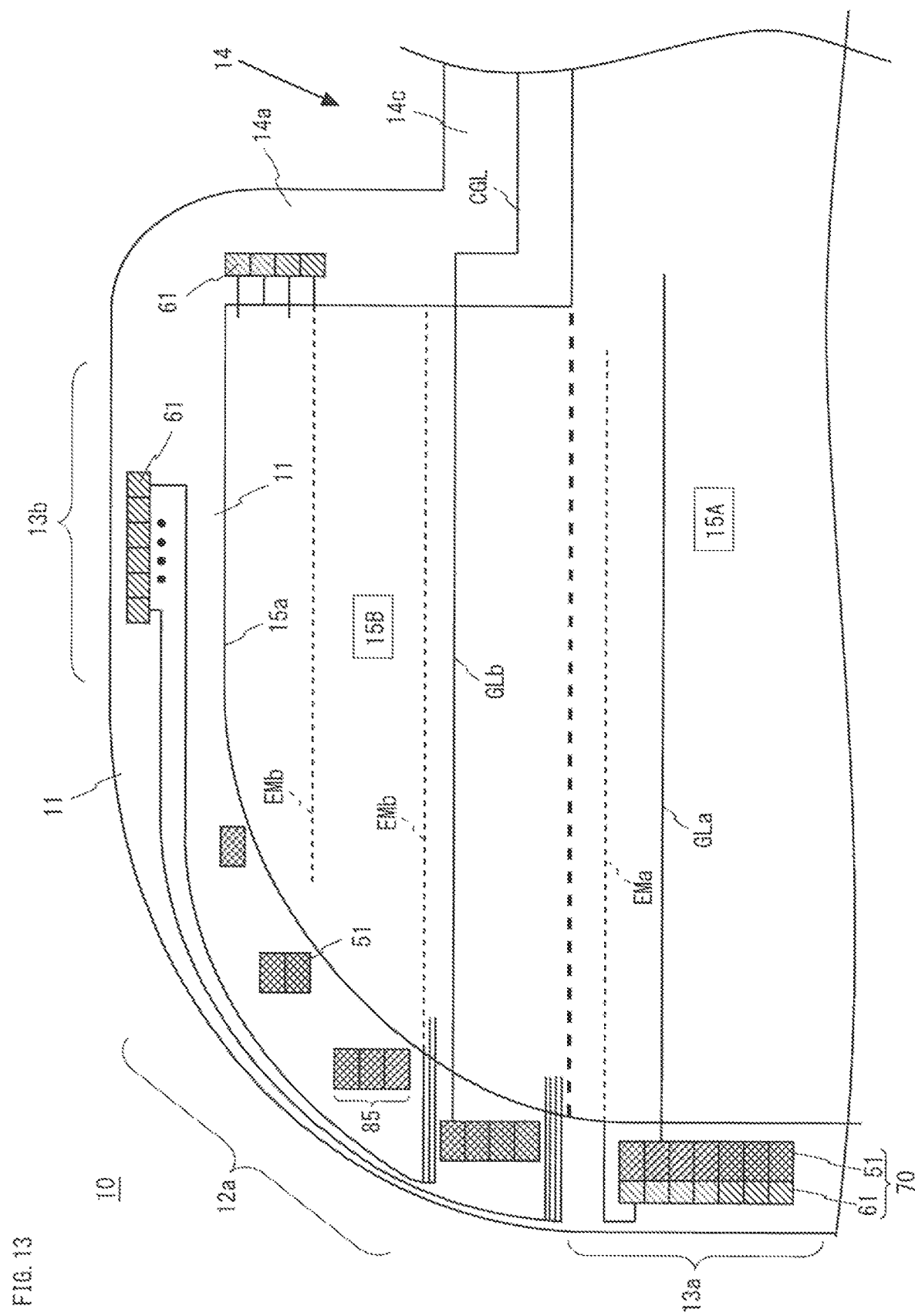
FIG. 13 is the diagram illustrating a portion of a display panel in the a embodiment.

FIG. 13 is a diagram illustrating a portion of the display panel 10 in the present embodiment. As shown in FIG. 13, in the present embodiment, arranged in the first side portion 13a are unit circuit blocks 70 including scan circuits 51 and emission circuits 61, and arranged in the first curvature portion 12a are parallel circuit blocks 85, each simply consisting of scan circuits 51. Arrangement of circuits in the first side portion 13a and the first curvature portion 12a, and connections of the circuits to lines in the first or second display area 15A or 15B are the same as in the first embodiment and therefore will not be elaborated upon.

In the first embodiment, all of the emission circuits 61 that respectively correspond to the scan circuits 51 arranged in the first curvature portion 12a are arranged in the second side portion 13b. However, in the present embodiment, only some of the emission circuits 61 that correspond to the scan circuits 51 arranged in the first curvature portion 12a are arranged in the second side portion 13b, which is close to the first curvature portion 12a. The rest of the emission circuits 61 are arranged in the first notch side section 14a.

As in the first embodiment, the emission circuits 61 arranged in the second side portion 13b, which is close to the first curvature portion 12a, are connected to lines that extend into the first curvature portion 12a along the outer periphery of the display panel 10 and are connected in the first curvature portion 12a to second emission control lines EMb formed in the second display area 15B. On the other hand, the emission circuits 61 arranged in the first notch side section 14a are connected to lines that are connected to second emission control lines EMb to which the lines should be connected after extending through the first notch side section 14a to the second emission control lines EMb. Note that the relationship between the second emission control lines EMb arranged in the second display area 15B and the third emission control lines arranged in the third display area 15C is the same as described in the first embodiment and therefore will not be elaborated upon.

2.2 Effects

In the present embodiment, some of the emission circuits 61 that respectively correspond to the scan circuits 51 arranged in the first curvature portion 12a are arranged in the second side portion 13b, which is close to the first curvature portion 12a, and the rest of the emission circuits 61 are arranged in the first notch side section 14a. In this case, the lines from the emission circuits arranged in the first notch side section 14a are connected to the second emission control lines EMb in the second display area 15B from the first notch side section 14a side, resulting in a fewer number of lines extending into the first curvature portion 12a. Thus, it is rendered possible to narrow the first curvature portion 12a and hence the frame area of the display panel 10.

2.3 Variant

Figure 14:
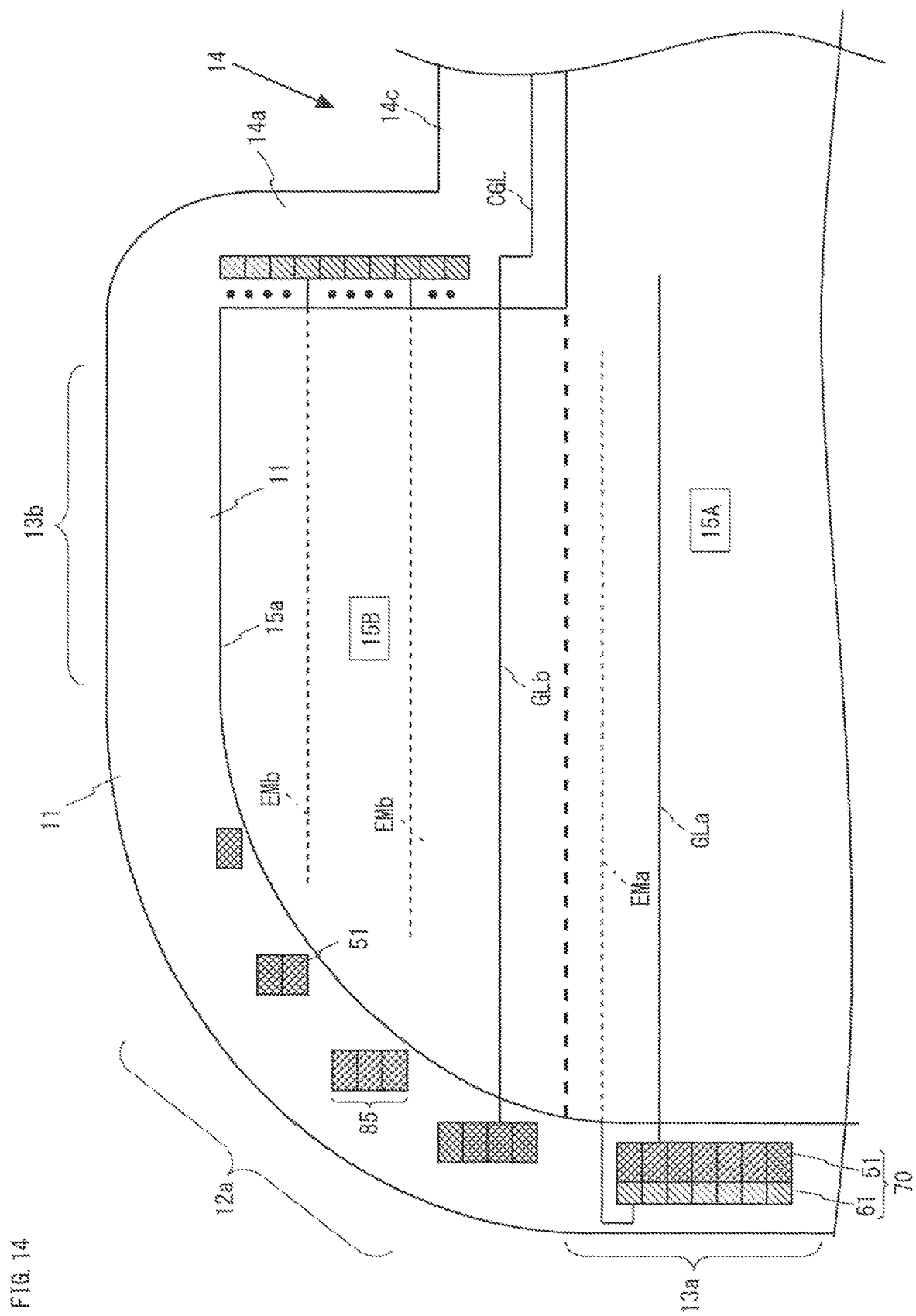
FIG. 14 is a diagram illustrating a portion of a display panel in a variant of the second embodiment.

FIG. 14 is a diagram illustrating a portion of the display panel 10 in a variant of the present embodiment. As shown in FIG. 14, in the present variant, all of the emission circuits 61 that respectively correspond to the scan circuits 51 arranged in the first curvature portion 12a are arranged in the first notch side section 14a. In this case, the emission circuits 61 arranged in the first notch side section 14a are connected to lines that are all connected to the second emission control lines EMb in the second display area 15B from the first notch side section 14a side, and therefore no lines extend from the emission circuits 61 into the first curvature portion 12a. Thus, it is rendered possible to further narrow the first curvature portion 12a and hence the frame area of the display panel 10.

3. Variants Common Among the Embodiments

Variants common among the first and second embodiments will be described below.

3.1 First Variant

In the first and second embodiments, the second scanning line GLb formed in the second display area 15B and the third scanning line GLc formed in the third display area 15C are connected by the connection line CGL so as to constitute a single scanning line. The scanning line obtained through connection with the connection line CGL is supplied at the end that is near the first curvature portion 12a with a scanning signal from the scan circuit 51 in the first curvature portion 12a and at the end that is near the second curvature portion 12b with a scanning signal from the scan circuit 51 in the second curvature portion 12b.

However, the second scanning line GLb formed in the second display area 15B may only be connected to the scan circuit 51 in the first curvature portion 12a, and the third scanning line GLc formed in the third display area 15C may only be connected to the scan circuit 51 in the second curvature portion 12b. In such a case, both the second scanning line GLb and the third scanning line GLc are shorter than the first scanning line GLa and therefore can be formed readily and rendered more resistant to waveform rounding of scanning signals due to load capacitances on the scanning lines GLb and GLc.

3.2 Second Variant

Figure 15:
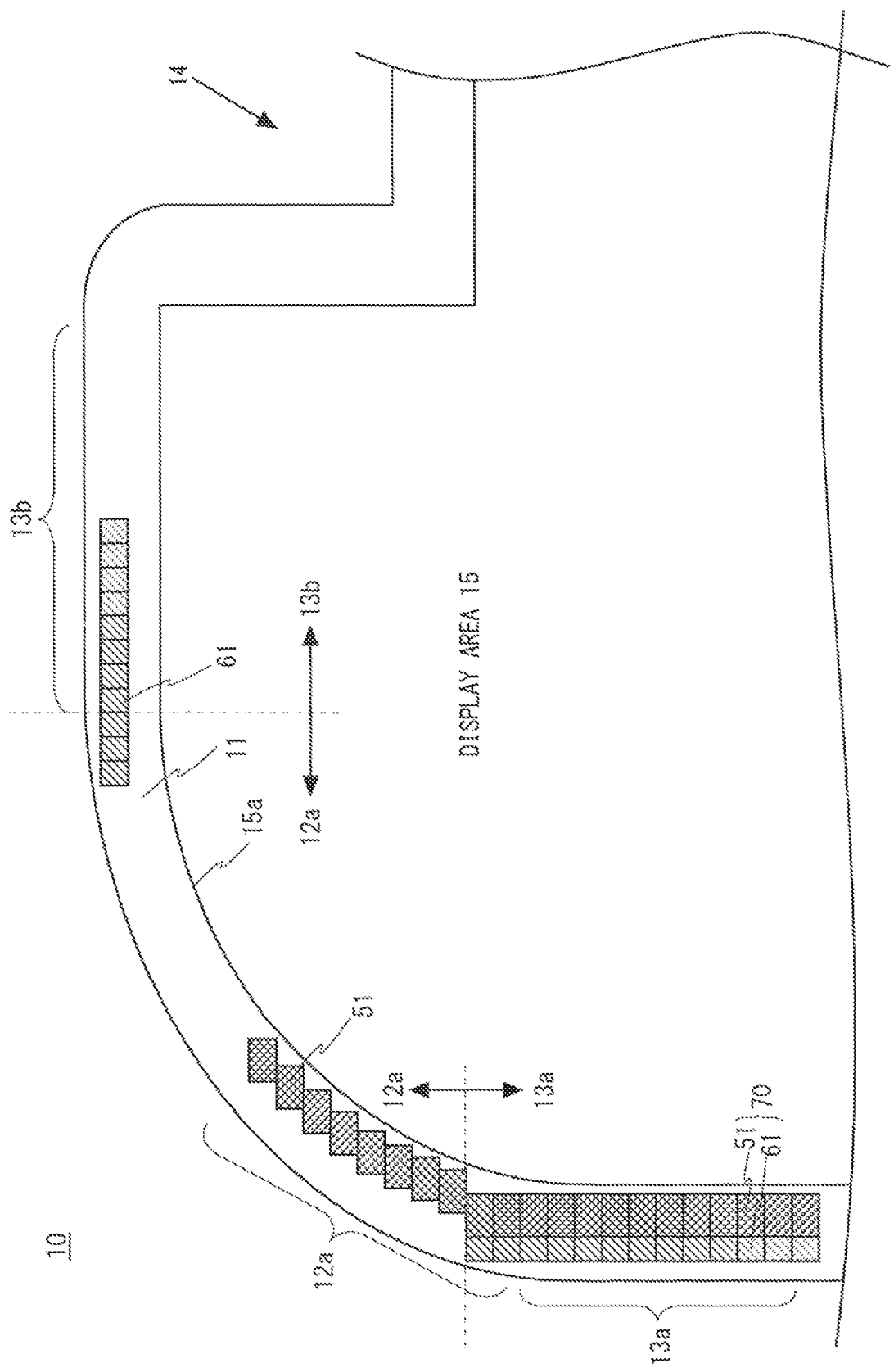
FIG. 15 is a diagram illustrating a portion of a display panel in a second variant common among the embodiments.

FIG. 15 is a diagram illustrating a portion of the display panel 10 in a second variant. The frame area of the display panel 10 can be narrowed almost without being affected by circuit arrangement even when an array of unit circuit blocks 70 does not completely transition to an array of scan circuits 51 at the boundary of the first side portion 13a and the first curvature portion 12a. Accordingly, in the present variant, in an area of the first curvature portion 12a that is adjacent to the first side portion 13a, a few to several unit circuit blocks 70 may be arranged along the outer edge 15a, as are the unit circuit blocks 70 in the first side portion 13a, and followed only by scan circuits 51 arranged along the outer edge 15a, as shown in FIG. 15. In this manner, the unit circuit blocks 70 consisting of scan circuits 51 and emission circuits 61 may be arranged in the area of the first curvature portion 12a that is near the first side portion 13a.

Similarly, the frame area of the display panel 10 can be narrowed almost without being affected by circuit arrangement even when an array of scan circuits 51 does not completely transition to an array of emission circuits 61 at the transitional boundary from the first curvature portion 12a to the second side portion 13b. Accordingly, a few to several of the emission circuits 61 to be arranged in the second side portion 13b may be provided in an area of the first curvature portion 12a that is adjacent to the second side portion 13b, and the rest of the emission circuits 61 may be arranged in the second side portion 13b.

3.3 Third Variant

The first and second embodiments have been described with respect to the case where the parallel circuit blocks 85 consisting of scan circuits 51 are arranged in the first curvature portion 12a. However, this does not limit the arrangement of the scan circuits 51 in the first curvature portion 12a, and for example, the scan circuits 51 may be arranged in a stepped pattern along the outer edge 15a of the second display area 15B or in a radiating pattern from the outer edge 15a.

4. Moisture Proofing Measures for the Light-Emitting Display Element

Each pixel circuit 65 includes a light-emitting display element, which is adversely affected by moisture entry and suffers performance deterioration. Moisture enters the display panel 10 from the outer edge and reaches the light-emitting display element. Accordingly, with a view to preventing external moisture from reaching the light-emitting display element upon entry of moisture, a trench is provided inside and along the outer edge 15a of the display panel 10. Described below are features of the display panel 10 that prevent moisture entry.

Figure 16:
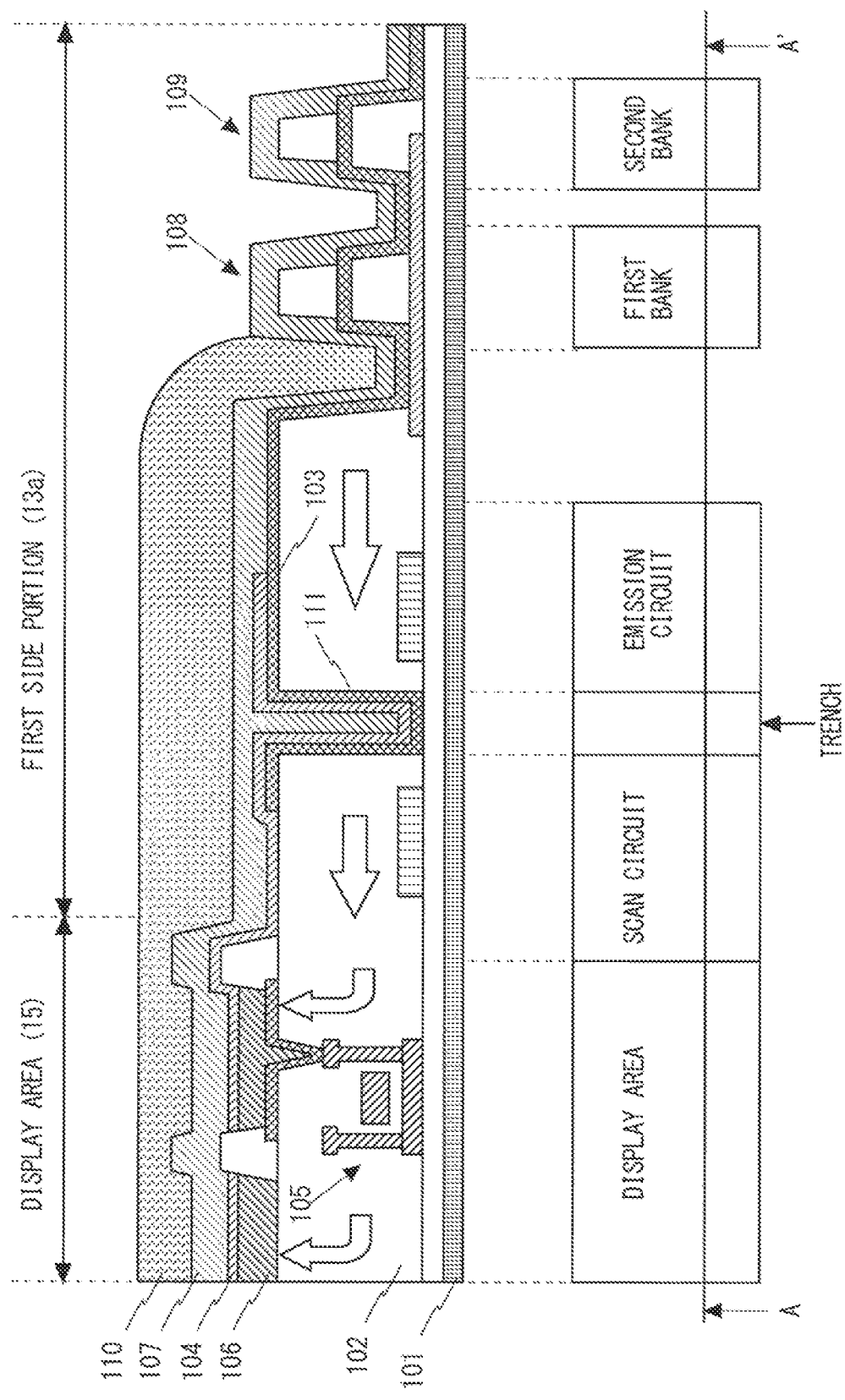
FIG. 16 provides a cross-sectional view and a plan view illustrating the structure of the display panel included in the display device according to the first embodiment.

FIG. 16 provides a cross-sectional view and a plan view illustrating the structure of the display panel 10 included in the display device according to the first embodiment. FIG. 16 shows the display area 15 and the first side portion 13a on a substrate 101 made of an organic film such as a polyimide film. Formed in the display area 15 are TFTs 105 to constitute a pixel circuit 65 and also a planarizing film 102 made of, for example, polyimide, and formed so as to cover the TFTs 105 for surface planarization. Provided on the planarizing film 102 is an emission layer 106 included in a light-emitting display element with one terminal connected to a drain electrode of a TFT 66 and the other terminal connected to a cathode electrode 104. The emission layer 106 shown in FIG. 16 includes a portion of a red emission layer and a portion of a blue emission layer. Note that although not shown, there is also formed a green emission layer.

In the first side portion 13a, the scan circuit 51 and the emission circuit 61 are arranged with the trench 111 positioned therebetween. The first side portion 13a with the scan circuit 51 and the emission circuit 61 formed thereon is covered by the planarizing film 102 for surface planarization. The trench 111 is formed so as to extend through the planarizing film 102 from top to bottom and has an inner surface covered by a source electrode 103, the surface of which is in turn covered by the cathode electrode 104. There are first and second banks 108 and 109 arranged in parallel and located outside with respect to the emission circuit 61.

The display area 15 and the first side portion 13a are covered by an inorganic film 107 such as a silicon oxide film or a silicon nitride film. Moreover, the entire surface of the inorganic film 107 is covered by an organic film 110 such as an acrylic resin film. The inorganic film 107 does not allow much moisture to pass through, and therefore even when there is external moisture entry, the inorganic film 107 blocks such moisture. The first bank 108 and the second bank 109, which is located outside with respect to the first bank 108, are formed so as to function as stoppers for keeping the organic film 110 from flowing out of the display panel 10 during the process of formation of the organic film 110.

In the case where the display panel 10 thus structured does not include the trench 111, moisture enters the display panel 10 from the side and passes through the planarizing film 102 to the emission layer 106, as indicated by arrows, leading to deterioration of the emission layer 106. Therefore, the trench 111 is formed so as to extend through the planarizing film 102 from top to bottom between the scan circuit 51 and the emission circuit 61. Moreover, the inner surface of the trench 111 is covered by the source electrode 103 and the cathode electrode 104, and the cathode electrode 104 surrounds a space filled in with the inorganic film 107. By providing the trench 111 as above, it is rendered possible that moisture entering through the side of the display panel 10 is blocked from reaching the emission layer 106 formed in the display area 15. Moreover, moisture entering through the surface of the display area 15 is also blocked by the inorganic film 107. In this manner, the inorganic film 107 protects the emission layer 106 from external moisture entry.

Figure 17:
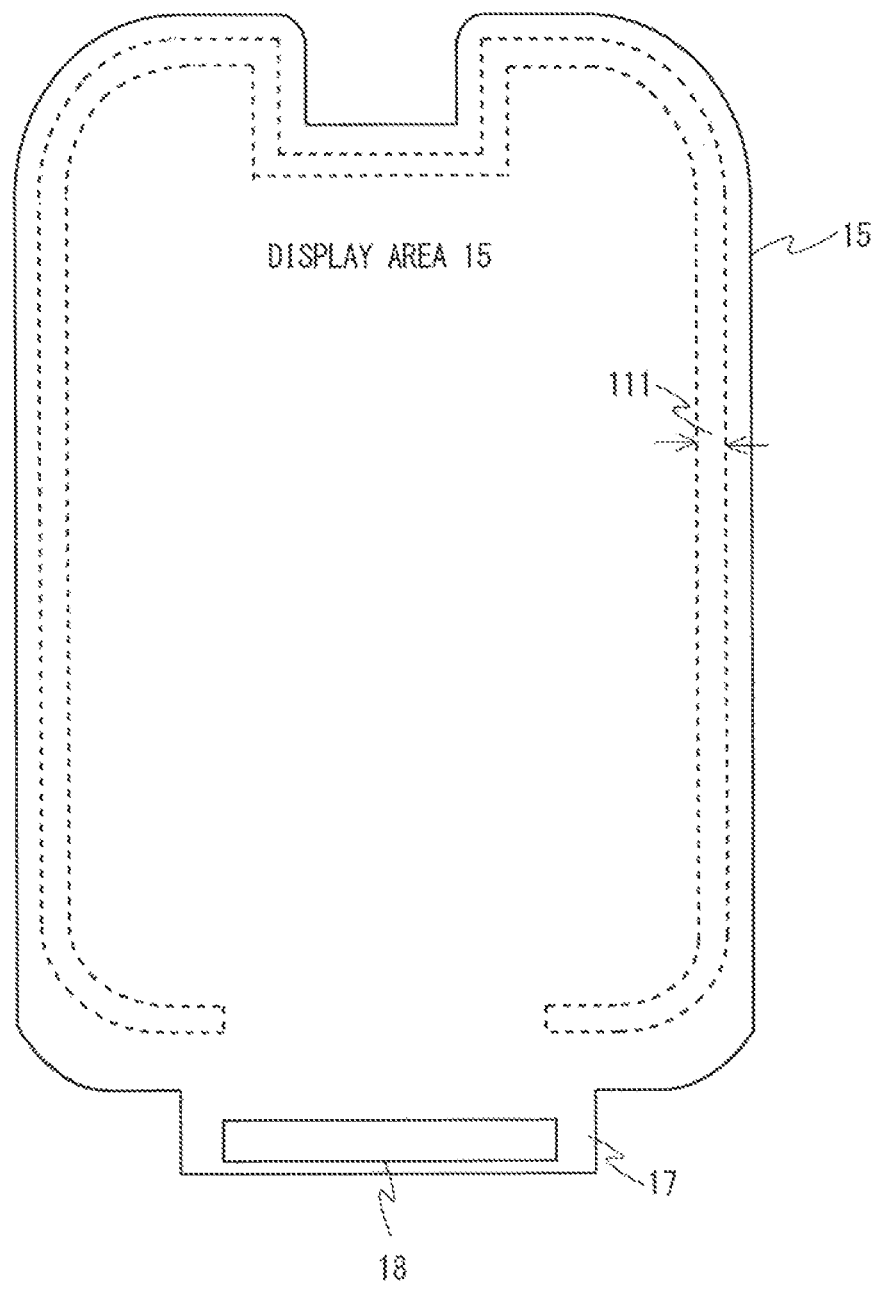
FIG. 17 is a diagram illustrating the shape of a trench formed in the display panel included in the display device according to the first embodiment.

FIG. 17 is a diagram illustrating the shape of the trench 111 formed in the display panel 10 included in the display device according to the first embodiment, and FIG. 18 is a diagram illustrating the positional relationship of the trench 111 to scan circuits 51 and emission circuits 61. As shown in FIG. 17, the trench 111 is formed along the outer periphery of the display panel 10, except in the area of the fourth side portion 13d where the terminal portion 18 is provided. Accordingly, moisture entering the display panel 10 can be almost completely blocked. Specifically, as shown in FIG. 18, the trench 111 is located: between scan circuits 51 and emission circuits 61 in areas where the scan circuits 51 and the emission circuits 61 are arranged, as in the first side portion 13a; outside with respect to scan circuits 51 in areas where only the scan circuits 51 are arranged, as in the first curvature portion 12a; and outside with respect to emission circuits 61 in areas where only the emission circuits 61 are arranged, as in the second side portion 13b. Moreover, the trench 111 is located approximately in the middle of side or curvature portions where neither scan circuits 51 nor emission circuits 61 are provided.

5. Appendixes

In Appendix 1, a display device includes a display panel including: a display area having arranged therein a plurality of scanning lines, a plurality of emission control lines extending parallel to the scanning lines, a plurality of data lines crossing the scanning lines and the emission control lines, and a plurality of pixel circuits provided near respective intersections of the scanning lines and the data lines; a frame area provided around the display area and having provided therein a plurality of scan circuits configured to output scanning signals to the respective scanning lines, and a plurality of emission circuits configured to output emission control signals to the respective emission control lines; and a cutout portion extending from the frame area to some extent into the display area on at least one side, the frame area includes at least one curvature portion, a first side portion parallel to the data lines, and a second side portion parallel to the scanning lines, the at least one curvature portion being a curved portion positioned between the first side portion and the second side portion, and the emission control lines are connected at an outer edge of the display area to lines extending from the emission circuits that are disposed either in the second side portion or in a lateral section provided in the cutout portion so as to pass through the lateral section.

In Appendix 2 based on the display device of Appendix 1, the scan circuits and the emission circuits are arranged in the first side portion, and the scan circuits are also arranged in the curvature portion.

In the display device of Appendix 2, only the scan circuits are arranged in the curvature portion, so that the curvature portion can be narrowed.

In Appendix 3 based on the display device of Appendix 1, the emission control lines are connected at an outer edge of the curvature portion to lines extending from the emission circuits in the second side portion that are arranged near the curvature portion, and the emission control lines are connected at an outer edge of the lateral section to lines extending from the emission circuits in the second side portion that are arranged near the lateral section.

In the display device of Appendix 3, the emission control lines are connected at the outer edge of the lateral section to the lines extending from the emission circuits in the second side portion that are arranged near the lateral section of the cutout portion. Therefore, the lines extending from these emission circuits are not arranged in the curvature portion, so that the curvature portion can be narrowed.

In Appendix 4 based on the display device of Appendix 1, the emission control lines are connected at an outer edge of the lateral section to all lines extending from the emission circuits arranged in the second side portion.

In the display device of Appendix 4, the emission control lines are connected at the outer edge of the lateral section to all lines extending from the emission circuits arranged in the second side portion. Therefore, the lines extending from these emission circuits are not arranged in the curvature portion, so that the curvature portion can be further narrowed.

In Appendix 5 based on the display device of Appendix 1, some of the emission circuits are arranged in the second side portion, the rest of the emission circuits are arranged in the lateral section, the emission circuits in the second side portion have lines extending into the curvature portion and connected to the emission control lines at an outer edge of the curvature portion, and the rest of the emission circuits have lines extending into the lateral section and connected to the emission control lines at an outer edge of the lateral section.

In the display device of Appendix 5, the emission circuits that are not arranged in the second side portion are arranged in the lateral section of the cutout portion, and therefore the lines extending from these emission circuits are not arranged in the curvature portion. Thus, the curvature portion can be narrowed.

In Appendix 6 based on the display device of Appendix 1, the emission circuits arranged in the lateral section have lines extending into the lateral section and connected to the emission control lines in the lateral section.

In the display device of Appendix 6, the emission circuits are arranged in the lateral section of the cutout portion, and therefore the lines extending from the emission circuits are not arranged in the curvature portion. Thus, the curvature portion can be further narrowed.

In Appendix 7 based on the display device of Appendix 1, the frame area of the display panel further includes a third side portion and a curvature portion between the second and third side portions, the third side portion being positioned opposite to the first side portion with respect to the display area, the display area includes first and second discrete areas separated by the cutout portion, the first discrete area has a first discrete scanning line formed therein, the second discrete area has a second discrete scanning line formed therein, and the first and second discrete scanning lines are connected by a connection line formed across peripheral side sections of the cutout portion, and simultaneously receive at respective ends the same scanning signal supplied by scan circuits arranged in different curvature portions.

In the display device of Appendix 7, the first discrete scanning line formed in the first discrete area and the second discrete scanning line formed in the second discrete area are connected by the connection line formed across the peripheral side sections of the cutout portion, thereby constituting a single scanning line. By supplying such a scanning line with the same scanning signal simultaneously from scan circuits arranged in different curvature portions, it is rendered possible to inhibit waveform rounding of scanning signals due to load capacitances on scanning lines.

In Appendix 8 based on the display device of Appendix 7, the first discrete area further includes first discrete emission control lines formed therein, the second discrete area further includes second discrete emission control lines formed therein, first discrete emission control lines are supplied at respective ends with the emission control signals supplied from the emission circuits arranged in the curvature portion, and second discrete emission control lines are supplied at respective ends with the emission control signals supplied from the emission circuits arranged in the other curvature portion.

In the display device of Appendix 8, even when the waveform of the emission control signal is rounded, no adverse effects are caused, unlike in the case of the scan circuit. Therefore, the first and second discrete emission control lines are not required to be connected by a connection line, with the result that the production cost of the display device can be correspondingly reduced.

In Appendix 9 based on the display device of Appendix 1, the display panel further includes a terminal portion for connecting an external signal line to a line provided in the display panel, the terminal portion being provided on a side opposite to the cutout portion with respect to the display area.

In the display device of Appendix 9, the terminal portion is required to have other supply lines arranged for externally supplied signals. However, there is no need to arrange such lines in an area opposite to the terminal portion, and therefore the cutout portion can be disposed in such an area.

In Appendix 10 based on the display device of Appendix 1, the display device further includes a trench provided in a planarizing film in the frame area, the planarizing film being formed for flattening a surface of the display panel including the frame area with the scan circuits formed therein, the trench is a groove having a depth that extends through the planarizing film from top to bottom and an inner surface covered by a moisture-impermeable film, and in the curvature portion of the frame area, where only the scan circuits are arranged, the trench is formed along the scan circuits so as to be located outside with respect to the scan circuits.

In the display device of Appendix 10, the trench formed in the curvature portion of the frame area can prevent moisture entry from the edge of the display panel, and therefore can provide effective moisture proofing for electroluminescent elements.

In Appendix 11 based on the display device of Appendix 1, the display device further includes a trench provided in a planarizing film in the frame area, the planarizing film being formed for flattening a surface of the display panel including the frame area with the scan circuits formed therein, the trench is a groove having a depth that extends through the planarizing film from top to bottom and an inner surface covered by a moisture-impermeable film, and in a side portion or a lateral section of the frame area, where only the emission circuits are arranged, the trench is formed along the emission circuits so as to be located outside with respect to the emission circuits.

In the display device of Appendix 11, the trench formed in the side portion or lateral section of the frame area can prevent moisture entry from the edge of the display panel, and therefore can provide effective moisture proofing for electroluminescent elements.

DESCRIPTION OF THE REFERENCE CHARACTERS 10 display panel
11 frame area
12a first curvature portion
12b second curvature portion
13a first side portion
13b second side portion
13c third side portion
13d fourth side portion
14 notched portion (cutout portion)
14a first notch side section (first lateral section)
14b second notch side section (second lateral section)
15 display area
15a outer edge (of display area)
15A first display area
15B second display area (first discrete area)
15C third display area (second discrete area)
18 terminal portion
51 scan circuit
61 emission circuit
70 unit circuit block
85 parallel circuit block
D data line
GLa first scanning line
GLb second scanning line (first discrete scanning line)
GLc third scanning line (second discrete scanning line)
EMa first emission control line
EMb second emission control line (first discrete emission control line)
EMc third emission control line (second discrete emission control line)
CGL connection line

The invention claimed is:

1. A display device comprising a display panel, wherein, the display panel includes:
a display area having arranged therein a plurality of scanning lines, a plurality of emission control lines extending parallel to the scanning lines, a plurality of data lines crossing the scanning lines and the emission control lines, and a plurality of pixel circuits provided near respective intersections of the scanning lines and the data lines;
a frame area provided around the display area and having provided therein a plurality of scan circuits configured to output scanning signals to the respective scanning lines, and a plurality of emission circuits configured to output emission control signals to the respective emission control lines; and
a cutout portion extending from the frame area to some extent into the display area on at least one side,
the frame area includes at least one curvature portion, a first side portion parallel to the data lines, and a second side portion parallel to the scanning lines, the at least one curvature portion being a curved portion positioned between the first side portion and the second side portion,
the emission control lines are connected at an outer edge of the display area to lines extending from the emission circuits that are disposed either in the second side portion or in a lateral section provided in the cutout portion so as to pass through the lateral section,
the display device further comprising a trench provided in a planarizing film in the frame area, the planarizing film being formed for flattening a surface of the display panel including the frame area with the scan circuits formed therein,
the trench is a groove having a depth that extends through the planarizing film from top to bottom and an inner surface covered by a moisture-impermeable film, and
in the curvature portion of the frame area, where only the scan circuits are arranged, the trench is formed along the scan circuits so as to be located outside with respect to the scan circuits.

2. The display device according to claim 1, wherein, the scan circuits and the emission circuits are arranged in the first side portion, and
the scan circuits are also arranged in the curvature portion.

3. The display device according to claim 1, wherein, the emission control lines are connected at an outer edge of the curvature portion to lines extending from the emission circuits in the second side portion that are arranged near the curvature portion, and
the emission control lines are connected at an outer edge of the lateral section to lines extending from the emission circuits in the second side portion that are arranged near the lateral section.

4. The display device according to claim 1, wherein the emission control lines are connected at an outer edge of the lateral section to all lines extending from the emission circuits arranged in the second side portion.

5. The display device according to claim 1, wherein,
some of the emission circuits are arranged in the second side portion,
the rest of the emission circuits are arranged in the lateral section,
the emission circuits in the second side portion have lines extending into the curvature portion and connected to the emission control lines at an outer edge of the curvature portion, and
the rest of the emission circuits have lines extending into the lateral section and connected to the emission control lines at an outer edge of the lateral section.

6. The display device according to claim 1, wherein the emission circuits arranged in the lateral section have lines extending into the lateral section and connected to the emission control lines in the lateral section.

7. The display device according to claim 1, wherein,
the frame area of the display panel further includes a third side portion and another curvature portion between the second and third side portions, the third side portion being positioned opposite to the first side portion with respect to the display area,
the display area includes first and second discrete areas separated by the cutout portion,
the first discrete area has a first discrete scanning line formed therein, the second discrete area has a second discrete scanning line formed therein, and the first and second discrete scanning lines are connected by a connection line formed across peripheral side sections of the cutout portion, and simultaneously receive at respective ends the same scanning signal supplied by the scan circuits arranged in the curvature portion and the other curvature portion.

8. The display device according to claim 7, wherein, the first discrete area further includes first discrete emission control lines formed therein, the second discrete area further includes second discrete emission control lines formed therein, the first discrete emission control lines are supplied at respective ends with the emission control signals supplied from the emission circuits arranged in the curvature portion, and the second discrete emission control lines are supplied at respective ends with the emission control signals supplied from the emission circuits arranged in the other curvature portion.

9. The display device according to claim 1, wherein the display panel further includes a terminal portion for connecting an external signal line to a line provided in the display panel, the terminal portion being provided on a side opposite to the cutout portion with respect to the display area.

10. A display device comprising a display panel, wherein, the display panel includes:

a display area having arranged therein a plurality of scanning lines, a plurality of emission control lines extending parallel to the scanning lines, a plurality of data lines crossing the scanning lines and the emission control lines, and a plurality of pixel circuits provided near respective intersections of the scanning lines and the data lines;

a frame area provided around the display area and having provided therein a plurality of scan circuits configured to output scanning signals to the respective scanning lines, and a plurality of emission circuits configured to output emission control signals to the respective emission control lines; and a cutout portion extending from the frame area to some extent into the display area on at least one side, the frame area includes at least one curvature portion, a first side portion parallel to the data lines, and a second side portion parallel to the scanning lines, the at least one curvature portion being a curved portion positioned between the first side portion and the second side portion, the emission control lines are connected at an outer edge of the display area to lines extending from the emission circuits that are disposed either in the second side portion or in a lateral section provided in the cutout portion so as to pass through the lateral section, the display device further comprising a trench provided in a planarizing film in the frame area, the planarizing film being formed for flattening a surface of the display panel including the frame area with the scan circuits formed therein, the trench is a groove having a depth that extends through the planarizing film from top to bottom and an inner surface covered by a moisture-impermeable film, and in a side portion or a lateral section of the frame area, where only the emission circuits are arranged, the trench is formed along the emission circuits so as to be located outside with respect to the emission circuits.

11. The display device according to claim 10, wherein, the scan circuits and the emission circuits are arranged in the first side portion, and the scan circuits are also arranged in the curvature portion.

12. The display device according to claim 10, wherein, the emission control lines are connected at an outer edge of the curvature portion to lines extending from the emission circuits in the second side portion that are arranged near the curvature portion, and the emission control lines are connected at an outer edge of the lateral section to lines extending from the emission circuits in the second side portion that are arranged near the lateral section.

13. The display device according to claim 10, wherein the emission control lines are connected at an outer edge of the lateral section to all lines extending from the emission circuits arranged in the second side portion.

14. The display device according to claim 10, wherein, some of the emission circuits are arranged in the second side portion, the rest of the emission circuits are arranged in the lateral section, the emission circuits in the second side portion have lines extending into the curvature portion and connected to the emission control lines at an outer edge of the curvature portion, and the rest of the emission circuits have lines extending into the lateral section and connected to the emission control lines at an outer edge of the lateral section.

15. The display device according to claim 10, wherein the emission circuits arranged in the lateral section have lines extending into the lateral section and connected to the emission control lines in the lateral section.

16. The display device according to claim 10, wherein, the frame area of the display panel further includes a third side portion and another curvature portion between the second and third side portions, the third side portion being positioned opposite to the first side portion with respect to the display area, the display area includes first and second discrete areas separated by the cutout portion, the first discrete area has a first discrete scanning line formed therein, the second discrete area has a second discrete scanning line formed therein, and the first and second discrete scanning lines are connected by a connection line formed across peripheral side sections of the cutout portion, and simultaneously receive at respective ends the same scanning signal supplied by the scan circuits arranged in the curvature portion and the other curvature portion.

17. The display device according to claim 16, wherein, the first discrete area further includes first discrete emission control lines formed therein, the second discrete area further includes second discrete emission control lines formed therein, the first discrete emission control lines are supplied at respective ends with the emission control signals supplied from the emission circuits arranged in the curvature portion, and the second discrete emission control lines are supplied at respective ends with the emission control signals supplied from the emission circuits arranged in the other curvature portion.

18. The display device according to claim 10, wherein the display panel further includes a terminal portion for connecting an external signal line to a line provided in the display panel, the terminal portion being provided on a side opposite to the cutout portion with respect to the display area.

* * * * *